United States Patent [19]

Yoshida et al.

[11] Patent Number: 5,673,042
[45] Date of Patent: Sep. 30, 1997

[54] METHOD OF AND AN APPARATUS FOR COMPRESSING/DECOMPRESSING DATA

[75] Inventors: Shigeru Yoshida; Yoshiyuki Okada; Yasuhiko Nakano; Hironori Yahagi, all of Kawasaki, Japan

[73] Assignee: Fujitsu Limited, Kawasaki, Japan

[21] Appl. No.: 405,209

[22] Filed: Mar. 16, 1995

[30] Foreign Application Priority Data

Mar. 16, 1994 [JP] Japan ................................. 6-045874

[51] Int. Cl.⁶ ........................................ H03H 7/00
[52] U.S. Cl. .............................. 341/51; 341/65; 341/67
[58] Field of Search ........................... 341/63, 65, 67, 341/79, 106, 51

[56] References Cited

U.S. PATENT DOCUMENTS 4,899,148  2/1990  Sato et al. ............................ 341/65
5,003,307  3/1991  Whiting et al. ....................... 341/51

Primary Examiner—Jeffrey A. Gaffin
Assistant Examiner—Peguy JeanPierre
Attorney, Agent, or Firm—Staas & Halsey

[57] ABSTRACT

The present invention relates to a method of and an apparatus for compressing/decompressing data, to improve the compression ratio of sliding-dictionary-type Ziv-Lempel codes. A sliding-dictionary-type data compression method finds a matching character string in a coding character string and in a coded character string stored in a dictionary 101. According to the length of the matching character string, the method chooses a raw data mode that codes the matching character string that must consist of a single character as it is, or a reproduction mode that codes the position and length in the dictionary 101 of the matching character string. The method allocates consecutive numbers to different codes to be prepared under the raw data mode and reproduction mode. The method relates any code prepared under one of the raw data mode and reproduction mode to a corresponding one of the consecutive numbers, codes the number according to a code book, and rearranges the code book to shorten the length of the code of the number.

33 Claims, 22 Drawing Sheets

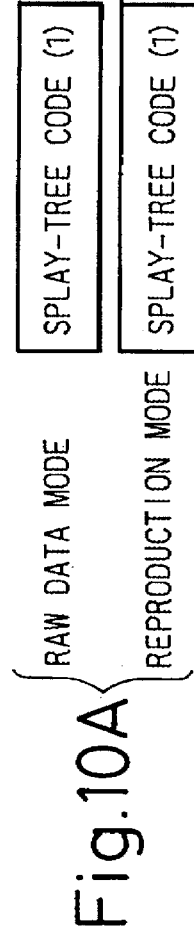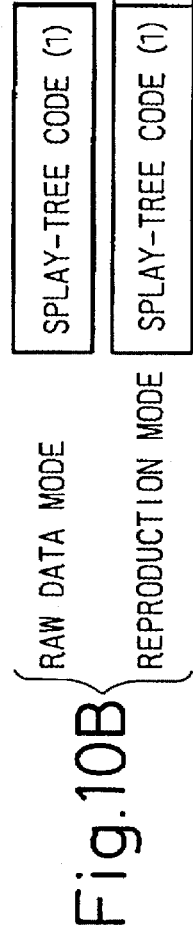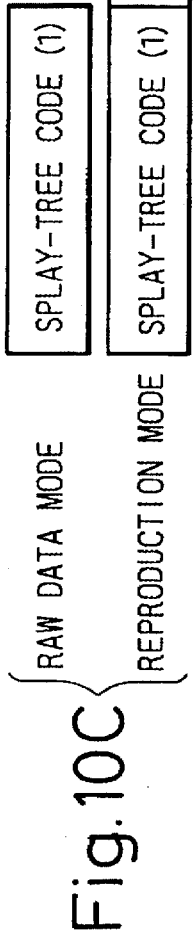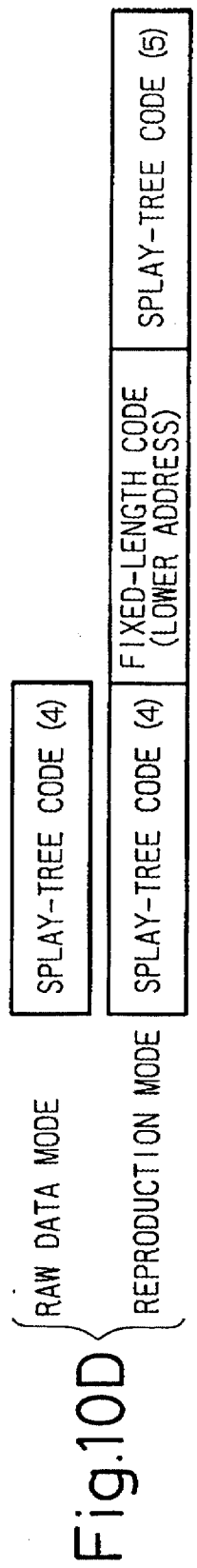

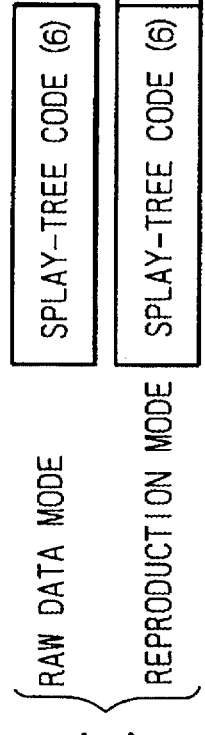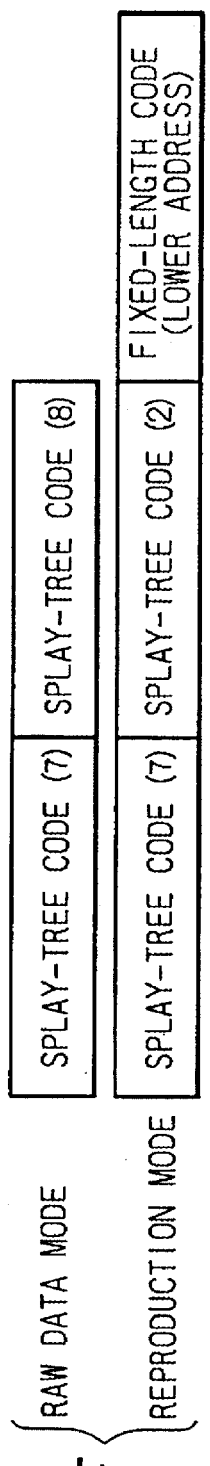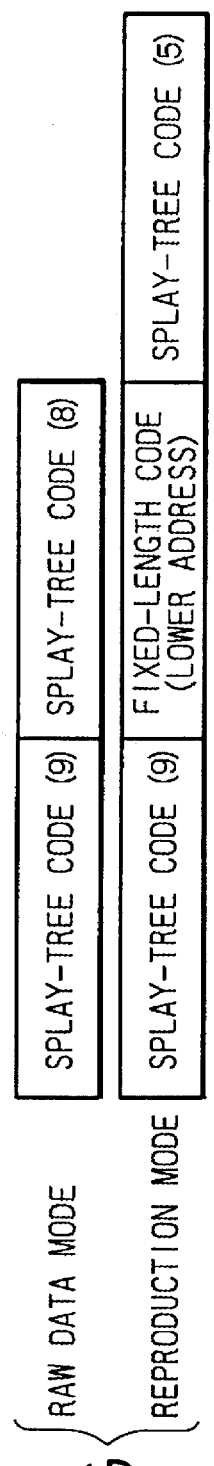

Fig. 24A
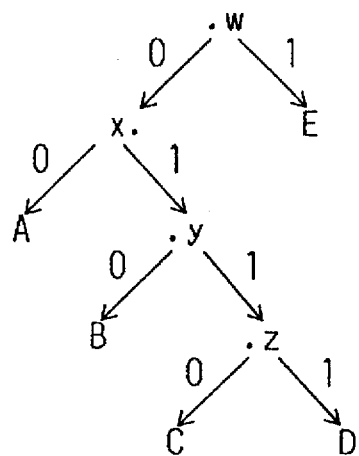
Fig. 24B
|   | CODE |   |   |   |
|---|---|---|---|---|
| A | 0 | 0 |   |   |
| B | 0 | 1 | 0 |   |
| C | 0 | 1 | 1 | 0 |
| D | 0 | 1 | 1 | 1 |
| E | 1 |   |   |   |
Fig. 24C
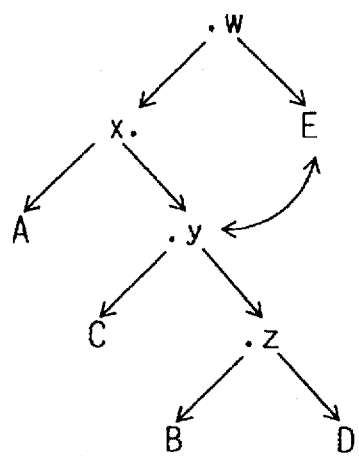
Fig. 24D
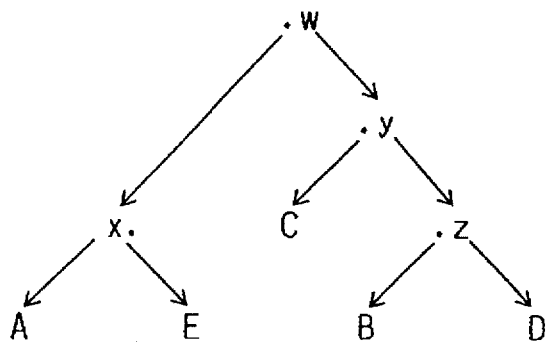
Fig. 24E
|   | CODE |   |   |   |
|---|---|---|---|---|
| A | 0 | 0 |   |   |
| B | 1 | 1 | 0 |   |
| C | 1 | 0 |   |   |
| D | 1 | 1 | 1 |   |
| E | 0 | 1 |   |   |

METHOD OF AND AN APPARATUS FOR COMPRESSING/DECOMPRESSING DATA

BACKGROUND OF THE INVENTION

1. Filed of the Invention

The present invention relates to a method of and an apparatus for compressing data according to a sliding-dictionary-type Ziv-Lempel coding method, and a method of and an apparatus for decompressing original data from such compressed data.

2. Description of the Related Art

Improvements in information processing techniques have made computers process a large quantity of various data such as character codes, vector information, and images.

It is required to provide a technique of compressing redundant data and a technique of decompressing original data from compressed data. To realize the requirement, a universal coding method has been proposed.

One of the coding techniques based on the universal coding method is Ziv-Lempel coding method (hereinafter referred to as the ZL coding method). This method is explained in "Ziv-Lempel Data Compression Method" by Seiji Munakata, Information Processing, Vol. 26, No. 1, 1985, pp. 2 to 6. There are a sliding-dictionary-type ZL coding method and an incremental-parsing-type ZL coding method. The sliding-dictionary-type ZL coding method provides a high compression ratio although it involves many operations. An improvement of the sliding-dictionary-type algorithm is an LZSS coding method disclosed by T. C. Bell in "Better OPM/L Text Compression," IEEE Trans. on Commun., Vol. COM-34, No. 12, Dec., 1986. Archive management software "LEA" for personal computers is an application of the sliding-dictionary-type ZL coding method.

The sliding-dictionary-type ZL coding method detects a longest matching character string in a coding character string and in a coded character string and codes the position and length of the detected matching character string.

The character mentioned above corresponds to a word, and a series of words forms a character string. These definitions are applicable through this specification.

SUMMARY OF THE INVENTION

An object of the present invention is to provide a method of and an apparatus for compressing data according to the sliding-dictionary-type ZL coding technique, to achieve a high compression ratio irrespective of the statistical characteristics of input data.

Another object of the present invention is to provide a method of and an apparatus for decompressing data from codes compressed by the data compression method and apparatus of the present invention.

In accordance with one aspect of the present invention, there is provided a method of compressing data by a sliding-dictionary technique that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary, comprising the steps of: consecutively numbering different codes to be prepared under the raw data mode and reproduction mode; coding, according to a code book, a number corresponding to a code prepared under one of the raw data mode and reproduction mode; and rearranging the code book according to the code of the number, to shorten the length of the code of the number.

In accordance with another aspect of the present invention, there is provided an apparatus for compressing data by a sliding-dictionary technique, having a matching unit for finding a longest matching character string in a coding character string and in a coded character string stored in a dictionary and coding unit for selectively activating, according to the length of the longest matching character string, a raw data mode to provide the matching character string that must consist of a single character as it is as a code, or a reproduction mode to code the position and length of the matching character string in the dictionary, comprising: a code book containing a tree of codes corresponding to consecutive numbers allocated to characters to be prepared by the coding unit under the raw data mode and coincident lengths to be found by the coding unit under the reproduction mode; and a splay-tree coding unit for retrieving, from the code book, a code corresponding to a character prepared under the raw data mode or a coincident length found under the reproduction mode, and rearranging the tree to halve the length of the retrieved code.

In accordance with still another aspect of the present invention, there is provided an apparatus for compressing data by a sliding-dictionary technique, having matching unit for finding a longest matching character string in a coding character string and in a coded character string stored in a dictionary and coding unit for selectively activating, according to the length of the longest matching character string, a raw data mode to provide the matching character string that must consist of a single character as it is as a code, or a reproduction mode to code the position and length of the matching character string in the dictionary, comprising: a code book containing a tree of codes corresponding to consecutive numbers allocated to characters to be prepared by the coding unit under the raw data mode and every combination of bits of at least a part of the address of a matching character string to be found by the coding unit under the reproduction mode; and a splay-tree coding unit for retrieving, from the code book, a code corresponding to a character prepared under the raw data mode or at least a part of an input address found under the reproduction mode, and rearranging the tree to halve the length of the retrieved code.

In accordance with still another aspect of the present invention, there is provided an apparatus for compressing data by a sliding-dictionary technique, having matching unit for finding a longest matching character string in a coding character string and in a coded character string stored in a dictionary and coding unit for selectively activating, according to the length of the longest matching character string, a raw data mode to provide the matching character string that must consist of a single character as it is as a code, or a reproduction mode to code the position and length of the matching character string in the dictionary, comprising: a code book containing a tree of codes corresponding to consecutive numbers allocated to every combination of higher bits of a character to be prepared by the coding unit under the raw data mode and different codes to be prepared by the coding unit under the reproduction mode; a code book containing a tree of codes allocated to every combination of lower bits of the character, for each of the combinations of the higher bits of the character; a splay-tree coding unit for retrieving, from the code book, a code corresponding to the higher part of a character prepared under the raw data mode or a code prepared under the reproduction mode, and rearranging the tree to halve the length of the retrieved code; and a splay-tree coding unit for selecting one of the trees in the code book according to the higher part of the character prepared under the raw data mode, retrieving a code corresponding to the lower part of the character, and rearranging the tree to halve the length of the retrieved code.

In accordance with still another aspect of the present invention, there is provided a method of decompressing an original character string from codes prepared by a sliding-dictionary-type data compression method that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary, comprising the steps of: consecutively numbering different codes to be prepared under the raw data mode and reproduction mode and preparing a first code book containing codes corresponding to the consecutive numbers; extracting, from an input code, a first code corresponding to one of the consecutive numbers and decoding the first code according to the first code book; rearranging the first code book according to the code, to shorten the length of the code; determining whether it is the raw data mode or reproduction mode according to the number restored from the first code; and carrying out a decompressing process proper for the determined mode, on a code corresponding to the number.

In accordance with still another aspect of the present invention, there is provided a data decompressing apparatus having a decompress processing unit for decompressing an original character string from codes prepared by a sliding-dictionary-type data compression method that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary, and a dictionary for accumulating the decompressed original character string, the decompress processing unit comprising: a code book containing a tree of codes corresponding to consecutive numbers allocated to characters to be prepared under the raw data mode and coincident lengths to be found under the reproduction mode; an extraction unit for extracting, from an input code, a variable-length code as a first code; a splay-tree decoding unit for decoding the first code into a number according to the code book and rearranging the tree to halve the length of the code; a decision unit for determining whether it is the raw data mode or reproduction mode according to the number decompressed from the first code; and a character string decompressing unit for decompressing a character string by finding the same according to the number if it is the raw data mode, or by retrieving the same from the dictionary according to a coincident length obtained from the number if it is the reproduction mode.

In accordance with still another aspect of the present invention, there is provided a data decompressing apparatus having decompress processing unit for decompressing an original character string from codes prepared by a sliding-dictionary-type data compression method that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary, and a dictionary for accumulating the decompressed original character string, the decompression processing unit comprising: a code book containing a tree of codes corresponding to consecutive numbers allocated to characters to be prepared under the raw data mode and every combination of bits of at least a part of the address of a matching character string to be found under the reproduction mode; an extraction unit for extracting, from an input code, a variable-length code as a first code; a splay-tree decoding unit for decoding the first code into a number according to the code book and rearranging the tree to halve the length of the code; a decision unit for determining whether it is the raw data mode or reproduction mode according to the number decompressed from the first code; and a character string decompressing unit for decompressing a character string by finding the same according to the number if it is the raw data mode, or by retrieving the same from the dictionary according to at least a part of an address obtained from the number if it is the reproduction mode.

In accordance with still another aspect of the present invention, there is provided a data decompressing apparatus having a decompress processing unit for decompressing an original character string from codes prepared by a sliding-dictionary-type data compression method that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary, and a dictionary for accumulating the decompressed original character string, the decompressing processing unit comprising: a code book containing a tree of codes corresponding to consecutive numbers allocated to every combination of higher bits of a character to be prepared under the raw data mode and different codes to be prepared under the reproduction mode; a code book containing a tree of codes corresponding to every combination of lower bits of the character, for each of the combinations of the higher bits of the character; an extraction unit for extracting, from an input code, a variable-length code as a first code; a splay-tree decoding unit for decoding the first code into a number according to the code book and rearranging the tree to halve the length of the code; decision unit for determining whether it is the raw data mode or reproduction mode according to the number decompressed from the first code; an extraction unit for extracting a variable-length second code following the first code if it is the raw data mode; a splay-tree decoding unit for selecting one of the trees from the code book according to the higher part of a character specified by the number provided by the splay-tree decoding unit if it is the raw data mode, decoding the second code into the lower part of the character, and rearranging the tree to halve the length of the code; and a character string decompressing unit for decompressing the character string by combining the higher part of the character specified by the number provided by the splay-tree decoding unit with the lower part of the character provided by the splay-tree decoding unit if it is the raw data mode, or by retrieving the same from the dictionary according to a code corresponding to the number if it is the reproduction mode.

BRIEF DESCRIPTION OF THE DRAWINGS

In the drawings:

FIGS. 10A to 10G show examples of code words;

FIGS. 24A to 24E explain methods of forming splay-tree codes.

DESCRIPTION OF THE PREFERRED EMBODIMENTS

Before describing the preferred embodiments, a conventional art and its problem will be explained in detail with reference to FIGS. 22 to 24 below.

Figure 22:
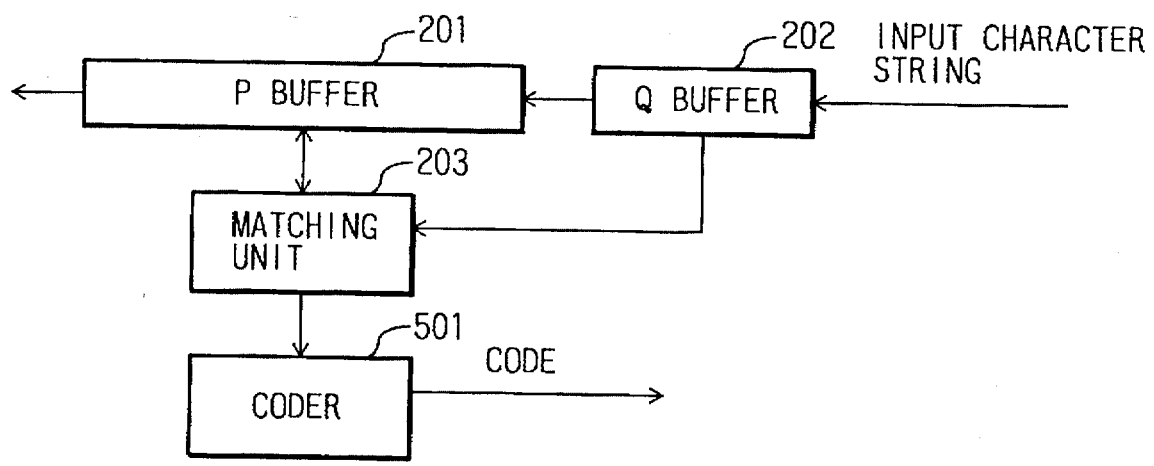
FIG. 22 shows a data compression apparatus according to a prior art.

FIG. 22 shows the principle of a data compression apparatus according to a prior art employing the LZSS coding method.

A P buffer 201 has a predetermined length to successively store character strings that have been coded. After the P buffer 201 stores character strings to the full capacity, the P buffer 201 discards an old character string whose length is determined by the length of a new input character string to receive.

A Q buffer 202 stores a coding character string, i.e., a character string to be coded. A matching unit 203 finds a longest matching character string in the Q buffer 202 and in the P buffer 201 and sends the position and length of the matching character string in the P buffer 201 to a coder 501.

Figure 23A:
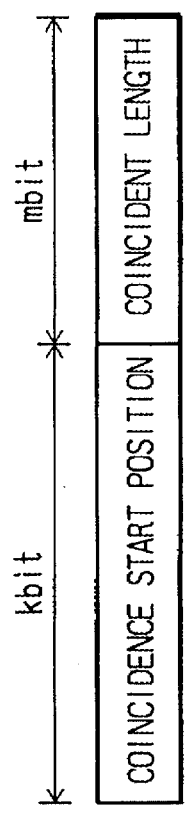
FIGS. 23A and 23B show code words.
Figure 23B:
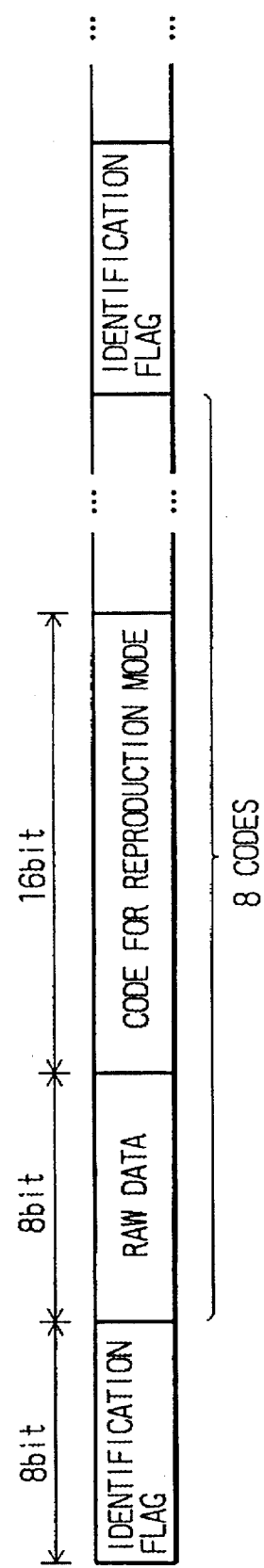

The coder 501 combines a k-bit start position of the matching character string with an m-bit length of the same, to form a code word shown in FIG. 23A. The code word is stored in an auxiliary storage unit such as a disk unit, or is sent to a line.

If the capacity of the P buffer 201 is 4 kilobits and that of the Q buffer 202 is 16 bits, the start position of a matching character string in the P buffer 201 is represented by 12 bits, and the length of the same is represented by 4 bits. Then, the length of the code word of FIG. 23A will be 2 bytes.

Each character is equal to a byte. If a matching character string found in the P buffer 201 consists of three or more characters, this character string is compressible. An English text containing repetitive character strings is greatly compressible.

The LZSS coding method employs a raw data mode if a matching character string contains two characters or smaller, to use the character string as it is as a code word without coding it. If a matching character string contains three characters or more, the method employs a reproduction mode to form a code word by combining the start position and length of the matching character string.

The method adds an identification flag to each code word, to indicate whether the code word has been prepared under the raw data mode or the reproduction mode. In practice, eight identification flags are collectively attached to the head of eight corresponding code words, to complete a series of code words shown in FIG. 23B.

In this way, the LZSS coding method employs fixed-length identification flags and code words of 8-bit units, to improve processing speed.

There is a variable length coding method that dynamically changes the length of each code depending on the frequencies of occurrence of characters in input data. An example of this method is a splay-tree coding method disclosed by D. W. Jones in "Application of Splay Trees to Data Compression," Communication of ACM, Vol. 31, No. 8, Aug., 1988.

The splay-tree coding method employs a code book containing a binary search tree whose leaves represent codes corresponding to characters. Whenever an input character is converted into a code, the tree is rearranged to halve the length of the code, thereby realizing dynamic coding.

FIGS. 24A to 24E explain the splay-tree coding methods to code, for example, five characters A, B, C, D, and E.

FIG. 24A is a tree of codes corresponding to a code book of FIG. 24B. FIGS. 24C and 24D show a process and result of rearranging the tree in connection with the character C to be coded. FIG. 24E shows a new code book based on the rearranged tree.

The depth of a parent node z of the character C is the same as that of the character B. The characters B and C are replaced with each other as shown in FIG. 24C. A new parent node y of the character C is replaced with the character E as shown in FIG. 24D, thereby halving the length of the character C from four bits to two bits as shown in FIGS. 24B and 24E.

This method is easier to form an algorithm and speedier than other dynamic variable-length coding methods such as a dynamic Huffman coding method and an adaptive multi-value arithmetic coding method.

The LZSS method codes raw data or a combination of the start position and length of a matching character string into a fixed-length code word. Namely, this method is based on assumptions that characters evenly occur under the raw data mode and that the start positions and lengths of matching character strings uniformly occur. In addition, the LZSS method is based on an assumption that the raw data mode and reproduction mode evenly occur when adding a one-bit identification flag to a code word.

In practice, however, characters unevenly occur, and a matching character string is usually found in a coded character string in the vicinity of a coding character string. Accordingly, the address of the start position of a matching character string in the P buffer 201 is of a relatively small value.

The frequency of finding an entire character string (16 characters) of the Q buffer 202 in the P buffer 201 is considerably smaller than the frequency of finding a matching character string of 3 to 5 characters.

The frequencies of occurrence of the raw data mode and reproduction mode differ from each other between the start of a coding process and when the P buffer 201 becomes full. At the start of a coding process, the P buffer 201 is empty, and as the coding process progresses, it is gradually filled with coded character strings. When there is a little data in the P buffer 201, the raw data mode more frequently occurs than the reproduction mode. The frequency of occurrence of the reproduction mode gradually increases. When coding an English text, only the raw data mode occurs at the start of a coding process. When the P buffer 201 is filled with coded character strings, the frequency of occurrence of the reproduction mode increases to about 80%.

The conventional LZSS coding method prepares fixed-length codes without regard to the position and length of each matching character string or the frequencies of occurrence of the raw data mode and reproduction mode. Accordingly, the coding efficiency thereof is low at the start of a coding process or when coded data is too small compared with the capacity of the P buffer 201. When coding a low-redundant Japanese text involving kanji and hiragana characters, the prior art achieves a very low compression ratio because it does not consider fluctuations in the frequencies of occurrence of the characters.

Although the LZSS coding method is capable of compressing data at a high speed because it employs a sliding-dictionary-type coding process to form fixed-length codes, a compression ratio achieved thereby is low due to the statistical characteristics of input data and compressing conditions.

To cover the disadvantage of the sliding-dictionary-type coding method and improve a compression ratio, there is a method of converting codes prepared by the sliding-dictionary-type coding method into variable-length codes.

Variable-length coding methods that may be combined with the sliding-dictionary-type coding method are a dynamic Huffman coding method (LHarc), an arithmetic coding method (LHARI), and a Huffman coding method (LHA) that collectively forms a code book for a predetermined length of input data and codes the input data into Huffman codes according to the code book. These methods are available as free software. These variable-length coding methods are slow in processing speed. Their processing speeds are, for example, a fraction of the processing speed of the LZSS coding method.

The dynamic Huffman coding method is described in "ALGORITHM 673 Dynamic Huffman Coding" by J. S. Vitter, ACM Trans. on Mathematical Software, Vol. 15, No. 2, June 1989, pp. 158 to 167. The arithmetic coding method is described in "Arithmetic Coding for Data Compression" by I. H. Witten et al., Communication of the ACM, Vol. 30, No. 6, June 1987, pp. 520 to 540.

The splay-tree coding method mentioned above is a kind of dynamic variable-length coding method. This method dynamically rearranges a tree of codes, to achieve a proper compression ratio irrespective of the statistical characteristics of input data. The processing speed of this method is high.

This method, however, codes input data character by character, which leaves redundancy of character strings in code words. Accordingly, the compression ratio of the splay-tree coding method is not comparative to that of the LZSS coding method when coding, for example, an English text involving high redundancy.

Figure 1:
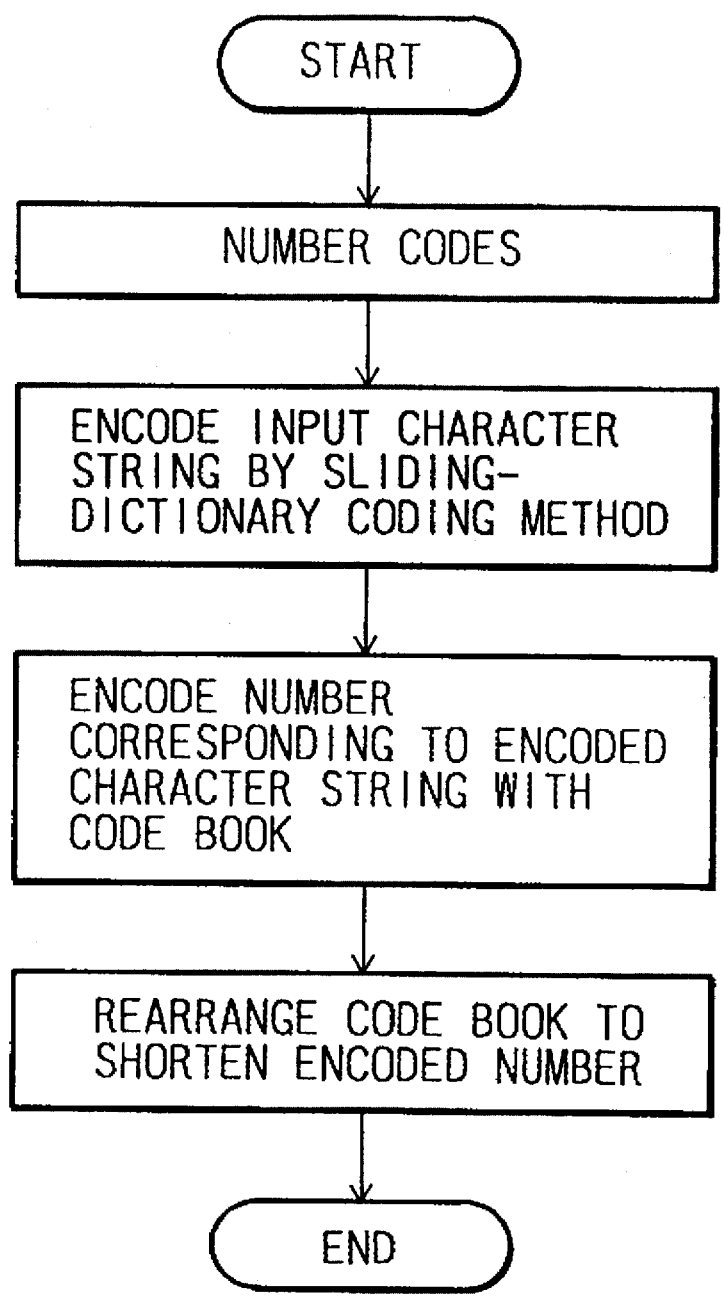
FIG. 1 shows the principle of a data compression method according to the present invention.

FIG. 1 shows the principle of a data compression method according to the present invention.

According to the invention of claim 1, there is provided a method of compressing data by a sliding-dictionary technique that finds a longest matching character string in a coding character string and in a coded character string stored in a dictionary 101 and activates, according to the length of the longest matching character string, a raw data mode to provide the matching character string that must consist of a single character as it is as a code, or a reproduction mode to code the position and length of the matching character string in the dictionary 101. This method includes the steps of consecutively numbering different codes to be prepared under the raw data mode and reproduction mode; coding, according to a code book, a number corresponding to a code prepared under one of the raw data mode and reproduction mode; and rearranging the code book according to the code of the number, to shorten the length of the code of the number.

According to the invention of claim 2, the data compression method of claim 1 includes the step of consecutively numbering code characters to be prepared under the raw data mode and different codes to be prepared under the reproduction mode.

According to the invention of claim 3, the data compression method of claim 1 includes the step of consecutively numbering different codes to be prepared under the raw data mode and different coincident lengths to be found under the reproduction mode.

According to the invention of claim 4, the data compression method of claim 3 includes the steps of coding, according to a code book, at least a part of the position of a matching character string under the reproduction mode; and rearranging the code book according to the coded position, to shorten the length of the coded position.

According to the invention of claim 5, the data compression method of claim 1 includes the step of consecutively numbering different codes to be prepared under the raw data mode and every combination of bits of at least a part of the address of a matching character string to be found under the reproduction mode.

According to the invention of claim 6, the data compression method of claim 5 includes the steps of coding, according to a code book, a coincident length under the reproduction mode; and rearranging the code book according to the code of the coincident length, to shorten the length of the code of the coincident length.

According to the invention of claim 7, the data compression method of claim 1 includes the step of consecutively numbering every combination of higher bits of a code character to be prepared under the raw data mode and different codes to be prepared under the reproduction mode; preparing a code book containing numbers allocated to combinations of lower bits of the code character, for each of the combinations of the higher bits of the code character; and forming, under the raw data mode, a variable-length code of a number allocated to the lower bits of a given code character, the number being found in the code book associated with the higher bits of the code character.

Figure 2:
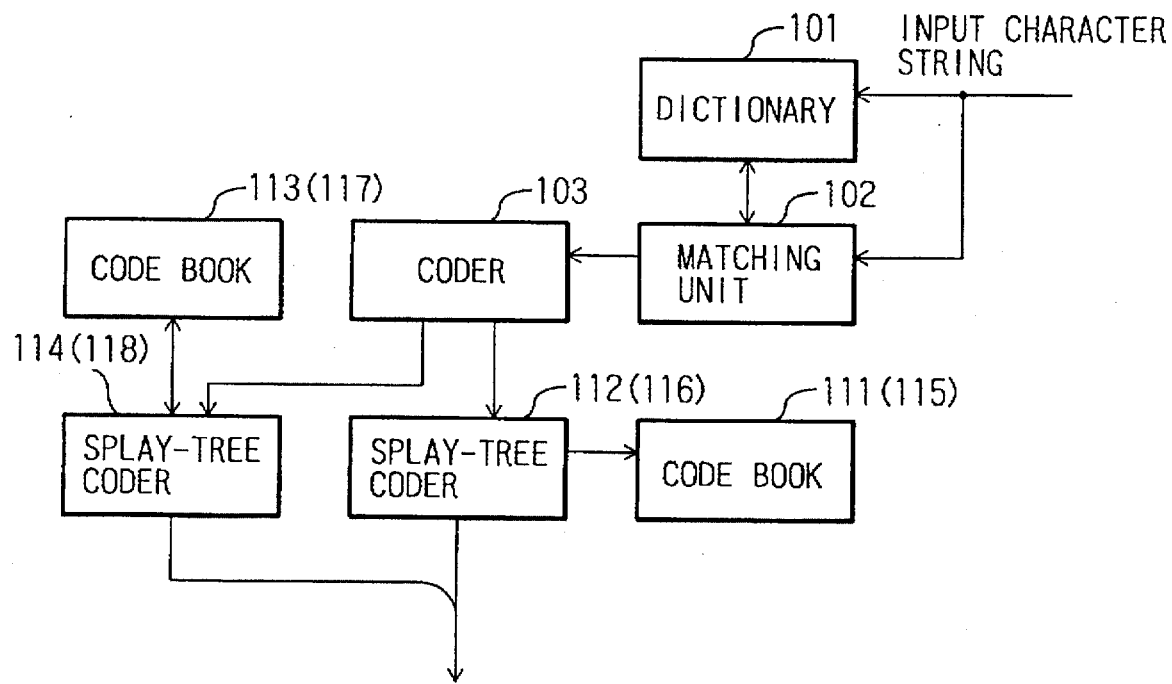
FIG. 2 is a block diagram showing the principle of a data compression apparatus according to any one of claims 8 to 11.

FIG. 2 is a block diagram showing the principle of the data compression apparatuses specified in claims 8 to 11 of the present invention.

The apparatus of claim 8 for compressing data by a sliding-dictionary technique has a matching unit 102 for finding a longest matching character string in a coding character string and in a coded character string stored in a dictionary 101 and a coder 103 for selectively activating, according to the length of the longest matching character string, a raw data mode to provide the matching character string that must consist of a single character as it is as a code, or a reproduction mode to code the position and length of the matching character string in the dictionary 101. The apparatus includes a code book 111 containing a tree of codes corresponding to consecutive numbers allocated to characters to be prepared by the coder 103 under the raw data mode and coincident lengths to be found by the coder 103 under the reproduction mode; and a splay-tree coder 112 for retrieving, from the code book 111, a code corresponding to a character prepared under the raw data mode or a coincident length found under the reproduction mode, and rearranging the tree to halve the length of the retrieved code.

According to the invention of claim 9, the data compression apparatus of claim 8 includes a code book 113 containing a tree of codes corresponding to combinations of at least a part of bits of the address of a matching character string provided by the coder 103 under the reproduction mode; and a splay-tree coder 114 for retrieving, from the code book 113, a code corresponding to at least a part of an input address, and rearranging the tree to halve the length of the retrieved code.

The apparatus of claim 10 for compressing data by a sliding-dictionary technique has a matching unit 102 for finding a longest matching character string in a coding character string and in a coded character string stored in a dictionary 101 and a coder 103 for selectively activating, according to the length of the longest matching character string, a raw data mode to provide the matching character string that must consist of a single character as it is as a code, or a reproduction mode to code the position and length of the matching character string in the dictionary 101. The apparatus includes a code book 115 containing a tree of codes corresponding to consecutive numbers allocated to characters to be prepared by the coder 103 under the raw data mode and every combination of bits of at least a part of the address of a matching character string to be found by the coder 103 under the reproduction mode; and a splay-tree coder 116 for retrieving, from the code book 115, a code corresponding to a character prepared under the raw data mode or at least a part of an input address found under the reproduction mode, and rearranging the tree to halve the length of the retrieved code.

According to the invention of claim 11, the data compression apparatus of claim 10 includes a code book 117 containing a tree of codes corresponding to coincident lengths to be found by the coder 103 under the reproduction mode; and a splay-tree coder 118 for retrieving, from the code book 117, a code according to an input coincident length, and rearranging the tree to halve the length of the retrieved code.

Figure 3:
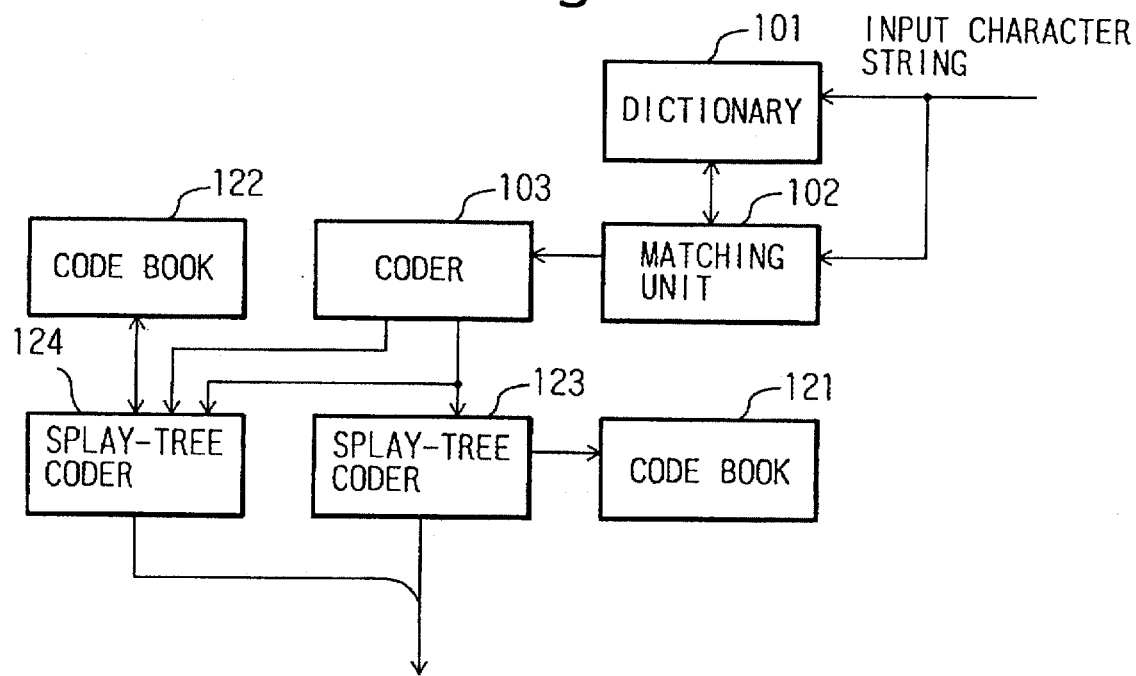
FIG. 3 is a block diagram showing the principle of a data compression apparatus according to claim 12.

FIG. 3 is a block diagram showing the principle of a data compression apparatus of claim 12 of the present invention.

This apparatus is for compressing data by a sliding-dictionary technique, having a matching unit 102 for finding a longest matching character string in a coding character string and in a coded character string stored in a dictionary 101 and a coder 103 for selectively activating, according to the length of the longest matching character string, a raw data mode to provide the matching character string that must consist of a single character as it is as a code, or a reproduction mode to code the position and length of the matching character string in the dictionary 101. The apparatus includes a code book 121 containing a tree of codes corresponding to consecutive numbers allocated to every combination of higher bits of a character to be prepared by the coder 103 under the raw data mode and different codes to be prepared by the coder 103 under the reproduction mode; a code book 122 containing a tree of codes allocated to every combination of lower bits of the character, for each of the combinations of the higher bits of the character; a splay-tree coder 123 for retrieving, from the code book 121, a code corresponding to the higher part of a character prepared under the raw data mode or a code prepared under the reproduction mode, and rearranging the tree to halve the length of the retrieved code; and a splay-tree coder 124 for selecting one of the trees in the code book 122 according to the higher part of the character prepared under the raw data mode, retrieving a code corresponding to the lower part of the character, and rearranging the tree to halve the length of the retrieved code.

Figure 4:
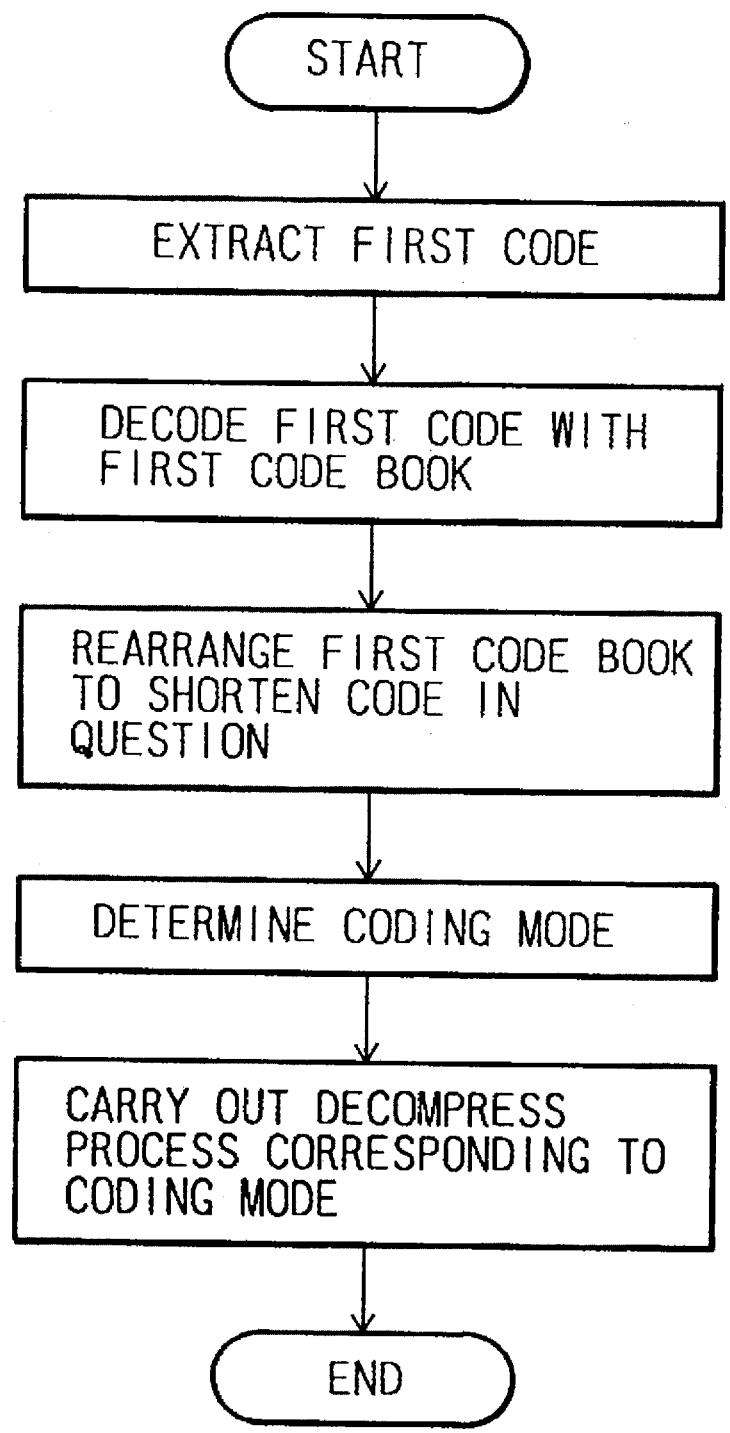
FIG. 4 shows the principle of a data decompressing method according to the present invention.

FIG. 4 shows the principle of a data decompressing method according to the present invention.

According to the invention of claim 13, there is provided a method of decompressing an original character string from codes prepared by a sliding-dictionary-type data compression method that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary. The method includes the steps of consecutively numbering different codes to be prepared under the raw data mode and reproduction mode and preparing a first code book containing codes corresponding to the consecutive numbers; extracting, from an input code, a first code corresponding to one of the consecutive numbers and decoding the first code according to the first code book; rearranging the first code book according to the code, to shorten the length of the code; determining whether it is the raw data mode or reproduction mode according to the number restored from the first code; and carrying out a decompressing process proper for the determined mode, on a code corresponding to the number.

According to the invention of claim 14, the data restoration method of claim 13 includes the steps of consecutively numbering code characters to be prepared under the raw data mode and different codes to be prepared under the reproduction mode; and decompressing an original character string according to the number restored from the first code if the first code indicates the raw data mode, and accumulating the original character string in a dictionary.

According to the invention of claim 15, the data decompressing method of claim 13 includes the steps of consecutively numbering different codes to be prepared under the raw data mode and different coincident lengths to be found under the reproduction mode; and decompressing a coincident length according to the number restored from the first code if the first code indicates the reproduction mode.

According to the invention of claim 16, the data decompressing method of claim 15 includes the steps of preparing a second code book containing codes corresponding to at least a part of the position of each matching character string; extracting a second code following the first code according to the second code book if the first code indicates the reproduction mode; decoding the second code according to the second code book, to restore at least a part of the position of a matching character string; and rearranging the second code book according to the code, to shorten the length of the code.

According to the invention of claim 17, the data decompressing method of claim 13 includes the steps of consecutively numbering different codes to be prepared under the raw data mode and every combination of bits of at least a part of the address of a matching character string to be found under the reproduction mode, and preparing a first code book containing codes corresponding to the consecutive numbers; and decompressing at least a part of an address according to the number restored from the first code if the first code indicates the reproduction mode.

According to the invention of claim 18, the data decompressing method of claim 17 includes the steps of preparing a second code book containing codes corresponding to coincident lengths; extracting a second code following the first code according to the second code book if the first code indicates the reproduction mode; decompressing a coincident length from the second code according to the second code book; and rearranging the second code book according to the code, to shorten the length of the code.

According to the invention of claim 19, the data decompressing method of claim 13 includes the steps of consecutively numbering every combination of higher bits of a code character to be prepared under the raw data mode and different codes to be prepared under the reproduction mode; preparing a code book containing numbers allocated to combinations of lower bits of the code character, for each of the combinations of the higher bits of the code character; decompressing the higher part of a character according to the number restored from the variable-length first code if the first code indicates the raw data mode; extracting a variable-length second code following the first code; and decompressing the lower part of the character by decoding the second code according to a code book corresponding to the higher part of the character.

Figure 5:
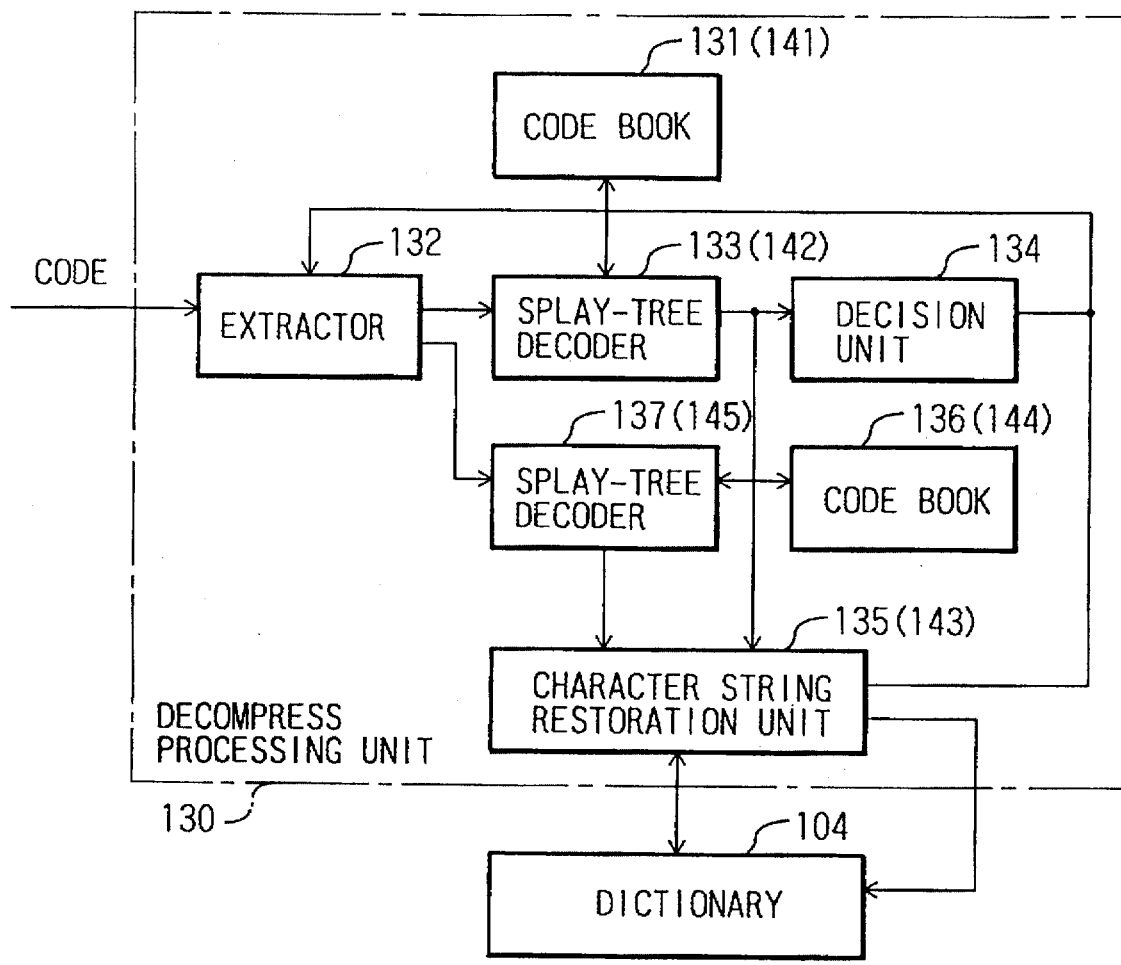
FIG. 5 is a block diagram showing the principle of a data decompressing apparatus according to any one of claims 20 to 24.
Figure 6:
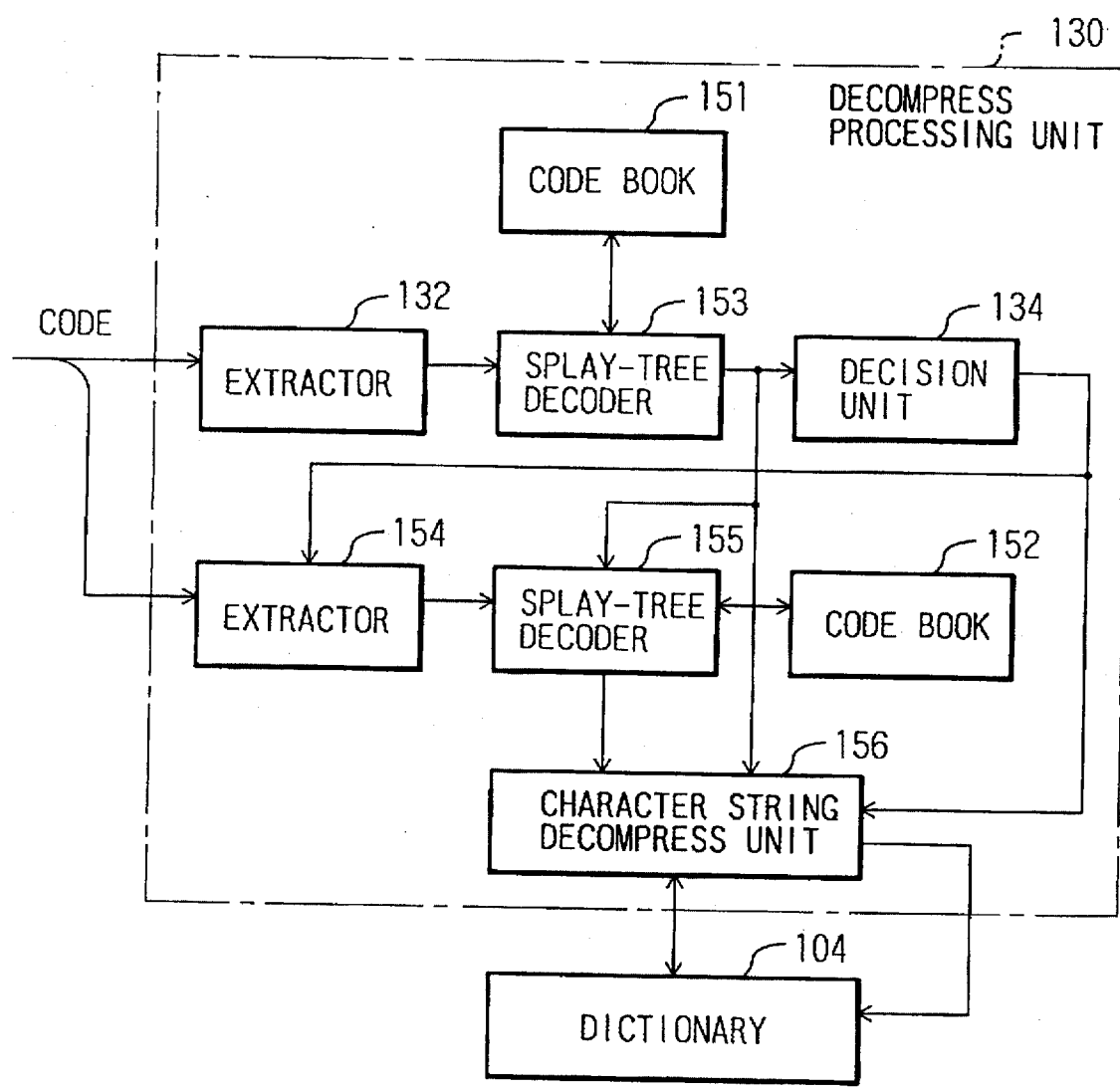
FIG. 6 is a block diagram showing the principle of a data decompressing apparatus according to claim 24.

FIG. 5 is a block diagram showing the principle of data decompressing apparatuses of claims 20 to 23.

The data decompressing apparatus of claim 20 has a decompress processing unit 130 for decompressing an original character string from codes prepared by a sliding-dictionary-type data compression method that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary, and a dictionary 104 for accumulating the restored original character string. The decompress processing unit 130 includes a code book 131 containing a tree of codes corresponding to consecutive numbers allocated to characters to be prepared under the raw data mode and coincident lengths to be found under the reproduction mode; an extractor 132 for extracting, from an input code, a variable-length code as a first code; a splay-tree decoder 133 for decoding the first code into a number according to the code book 131 and rearranging the tree to halve the length of the code; a decision unit 134 for determining whether it is the raw data mode or reproduction mode according to the number restored from the first code; and a character string decompressing unit 135 for decompressing a character string by finding the same according to the number if it is the raw data mode, or by retrieving the same from the dictionary 104 according to the coincident length obtained from the number if it is the reproduction mode.

According to the invention of claim 21, the decompress processing unit 130 of the data decompressing apparatus of claim 20 includes a code book 136 containing a tree of codes corresponding to every combination of at least a part of bits of the address of a matching character string to be found under the reproduction mode; and a splay-tree decoder 137 for decompressing a bit string from an input variable-length code according to the code book 136 and rearranging the tree to halve the length of the code. The extractor 132 extracts, as a second code, a variable-length code following the first code if the first code indicates the reproduction mode and sends the second code to the splay-tree decoder 137. The character string decompressing unit 135 retrieves, if it is the reproduction mode, a matching character string from the dictionary 104 according to the coincident length corresponding to the number provided by the splay-tree decoder 133 and an address represented by a bit string provided by the splay-tree decoder 137.

The data decompressing apparatus of claim 22 has a decompress processing unit 130 for decompressing an original character string from codes prepared by a sliding-dictionary-type data compression method that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary, and a dictionary 104 for accumulating the decompressed original character string. The decompress processing unit 130 includes a code book 141 containing a tree of codes corresponding to consecutive numbers allocated to characters to be prepared under the raw data mode and every combination of bits of at least a part of the address of a matching character string to be found under the reproduction mode; an extractor 132 for extracting, from an input code, a variable-length code as a first code; a splay-tree decoder 142 for decoding the first code into a number according to the code book 141 and rearranging the tree to halve the length of the code; a decision unit 134 for determining whether it is the raw data mode or reproduction mode according to the number decompressed from the first code; and a character string decompressing unit 143 for decompressing a character string by finding the same according to the number if it is the raw data mode, or by retrieving the same from the dictionary 104 according to at least a part of an address obtained from the number if it is the reproduction mode.

According to the invention of claim 23, the decompress processing unit 130 of the data decompressing apparatus of claim 22 includes a code book 144 containing a tree of codes corresponding to coincident lengths to be found under the reproduction mode; and a splay-tree decoder 145 for decompressing a coincident length from an input variable-length code according to the code book 144 and rearranging the tree to halve the length of the code. The extractor 132 extracts, as a second code, a variable-length code following the first code if the first code indicates the reproduction mode and sends the second code to the splay-tree decoder 145. The character string restoration unit 143 retrieves, if it is the reproduction mode, a matching character string from the dictionary 104 according to an address corresponding to the number provided by the splay-tree decoder 142 and the coincident length provided by the splay-tree decoder 145.

The data decompressing apparatus of claim 24 has a decompress processing unit 130 for decompressing an original character string from codes prepared by a sliding-dictionary-type data compression method that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary, and a dictionary 104 for accumulating the decompressed original character string. The decompress processing unit 130 includes a code book 151 containing a tree of codes corresponding to consecutive numbers allocated to every combination of higher bits of a character to be prepared under the raw data mode and different codes to be prepared under the reproduction mode; a code book 152 containing a tree of codes corresponding to every combination of lower bits of the character, for each of the combinations of the higher bits of the character; an extractor 132 for extracting, from an input code, a variable-length code as a first code; a splay-tree decoder 153 for decoding the first code into a number according to the code book 151 and rearranging the tree to halve the length of the code; a decision unit 134 for determining whether it is the raw data mode or reproduction mode according to the number decompressed from the first code; an extractor 154 for extracting a variable-length second code following the first code if it is the raw data mode; a splay-tree decoder 155 for selecting one of the trees from the code book 152 according to the higher part of a character specified by the number provided by the splay-tree decoder 153 if it is the raw data mode, decoding the second code into the lower part of the character, and rearranging the tree to halve the length of the code; and a character string decompressing unit 156 for decompressing a character string by combining the higher part of the character corresponding to the number provided by the splay-tree decoder 153 with the lower part of the character provided by the splay-tree decoder 155 if it is the raw data mode, or by retrieving the same from the dictionary 104 according to a code corresponding to the number if it is the reproduction mode.

The invention of claim 1 consecutively numbers different codes to be prepared under the raw data mode and reproduction mode and dynamically codes the numbers into variable-length codes according to the splay-tree coding method. Namely, this invention compresses LZSS codes by utilizing the difference between the frequencies of occurrence of the raw data mode and reproduction mode as well as fluctuations in the frequencies of occurrence of codes under the two modes.

The invention of claim 2 combines code characters to be prepared under the raw data mode with codes to be prepared under the reproduction mode and dynamically forms variable-length codes according to the splay-tree coding method. Namely, this invention compresses LZSS codes prepared under the raw data mode by utilizing fluctuations in the frequencies of appearance of characters in input character strings.

The invention of claim 3 combines coded coincident lengths obtained under the reproduction mode with codes obtained under the raw data mode and dynamically prepares variable-length codes according to the splay-tree coding method. Namely, this invention compresses LZSS codes prepared under the reproduction mode by utilizing an unevenness in the distribution of the lengths of matching character strings retrieved from the dictionary 101.

The invention of claim 4 applies the splay-tree coding method to at least a part of the address of a matching character string coded under the reproduction mode, to dynamically code it into a variable-length code. Namely, this invention compresses LZSS codes prepared under the reproduction mode by utilizing an unevenness in the distribution of positions of matching character strings retrieved from the dictionary 101.

The invention of claim 5 combines a part of the address of a matching character string coded under the reproduction mode with a code prepared under the raw data mode and dynamically prepares a variable-length code according to the splay-tree coding method. Namely, this invention compresses LZSS codes prepared under the reproduction mode by utilizing an unevenness in the distribution of the positions of matching character strings retrieved from the dictionary 101.

The invention of claim 6 applies the splay-tree coding method to a coincident length coded under the reproduction mode and dynamically forms a variable-length code. Namely, this invention compresses LZSS codes prepared under the reproduction mode by utilizing an unevenness in the distribution of the lengths of coincident character strings retrieved from the dictionary 101.

The invention of claim 7 divides a code character prepared under the raw data mode into higher and lower parts, combines the higher part with a code prepared under the reproduction mode, prepares a variable-length code, and codes the lower part into a variable-length code by subordinating the lower part to the higher part. Namely, this invention compresses LZSS codes prepared under the raw data mode by utilizing redundancy in the higher part of a character when the lower part thereof involves random components like image data. This invention is capable of compressing LZSS codes prepared under the raw data mode even if the higher and lower parts of each character are correlated to each other.

According to the invention of claim 8, the splay-tree coder 112 codes a character under the raw data mode and a coincident length under the reproduction mode into a splay-tree code according to a tree of codes stored in the code book 111. This invention compresses LZSS codes obtained under the raw data mode and reproduction mode by utilizing the difference between the frequencies of occurrence of the raw data mode and reproduction mode, fluctuations in the frequency of occurrence of characters under the raw data mode, and fluctuations in the frequency of occurrence of coincident lengths.

According to the invention of claim 9, the splay-tree coder 114 codes at least a part of an address coded under the reproduction mode into a splay-tree code according to a tree of codes stored in the code book 113. This invention compresses LZSS codes prepared under the reproduction mode by utilizing fluctuations in the positions of matching character strings.

According to the invention of claim 10, the splay-tree coder 116 codes a character under the raw data mode and at least a part of an address under the reproduction mode into a splay-tree code according to a tree of codes stored in the code book 115. This invention compresses LZSS codes prepared under the raw data mode and reproduction mode by utilizing the difference between the frequencies of occurrence of the raw data mode and reproduction mode, fluctuations in the frequency of occurrence of characters under the raw data mode, and fluctuations in the positions of matching character strings under the reproduction mode.

According to the invention of claim 11, the splay-tree coder 118 codes a coincident length coded under the reproduction mode according to a tree of codes stored in the code book 117. This invention compresses LZSS codes prepared under the reproduction mode by utilizing fluctuations in the frequency of occurrence of coincident lengths.

According to the invention of claim 12, the splay-tree coder 123 codes the higher part of a character prepared under the raw data mode and a code prepared under the reproduction mode into a splay-tree code according to a tree of codes stored in the code book 121. This invention compresses LZSS codes obtained under the raw data mode and reproduction mode by utilizing the difference between the frequencies of occurrence of the raw data mode and reproduction mode and fluctuations in the frequency of occurrence of bits of the higher part of each character. In this way, the higher part of each character is coded into a splay-tree code. Namely, regularity in the higher part of each character is utilized to compress input character strings in image data that involves random components in the lower part of each character to cause no fluctuations in the frequency of occurrence of complete characters.

The splay-tree coder 124 codes the lower part of a character into a splay-tree code according to a proper one of code trees stored in the code book 122 by subordinating the lower part to the higher part of the character. This invention compresses input character strings by utilizing fluctuations in the frequency of occurrence of characters when the higher part of a character is correlated to the lower part thereof like text data.

The invention of claim 13 decodes a first code extracted from an input code according to the splay-tree decoding method. A number restored from the first code is used to determine whether it is the raw data mode or reproduction mode. According to the determination, an LZSS code corresponding to the number is obtained.

Consecutive numbers are allocated to codes prepared under the raw data mode and reproduction mode according to the method of claim 1. The decompressed number is compared with a boundary number of the two modes, to determine one of the two modes. Accordingly, any code prepared under any one of the modes according to the method of claim 1 is decompressed.

The decompressed code is decoded into an original character string according to any known decoding method. In this way, the invention of claim 13 decompresses original character strings from code data provided by the method of claim 1.

The invention of claim 14 allocates consecutive numbers to characters under the raw data mode and codes prepared under the reproduction mode, similar to the method of claim 2. The invention of claim 14 decompresses a number from an input code prepared by the method of claim 2 under the raw data mode, and according to the number, decompresses a character.

The invention of claim 15 allocates consecutive numbers to codes prepared under the raw data mode and coincident lengths found under the reproduction mode, similar to the method of claim 3. The invention of claim 15 decompresses an input code prepared by the method of claim 3 under the reproduction mode, decompresses a coincident length from the number, and uses the coincident length for retrieving a matching character string.

The invention of claim 16 extracts a second code when a first code indicates the reproduction mode, decodes the second code according to the splay-tree decoding method, and obtains at least a part of the address of a matching character string. Namely, the invention of claim 16 restores an LZSS code under the reproduction mode from a code prepared by the method of claim 4 and uses the LZSS code for retrieving a matching character string.

The invention of claim 17 allocates consecutive numbers to codes to be prepared under the raw data mode and at least a part of each address to be prepared under the reproduction mode, similar to the method of claim 5. The invention of claim 17 decompresses a number from an input code prepared by the method of claim 5 under the reproduction mode, decompresses a part of an address from the number, and uses the partial address to retrieve a matching character string.

The invention of claim 18 extracts a second code when a first code indicates the reproduction mode and decodes the second code according to the splay-tree decoding method, to obtain a coincident length. This invention decompresses an LZSS code prepared under the reproduction mode from a code prepared by the method of claim 6 and uses the decompressed code to retrieve a matching character string.

The invention of claim 19 allocates consecutive numbers to the higher part of each character prepared under the raw data mode and codes prepared under the reproduction mode, similar to the method of claim 7. In connection with the higher part of a character, a code book for the lower part thereof is prepared. When a first code indicates the raw data mode, the first code is decoded into a number from which the higher part of a character is restored. At the same time, a second code is extracted and decoded according to a code book corresponding to the higher part of the decompressed character, to restore the lower part of the character.

The invention of claim 20 employs the code book 131 containing consecutive numbers allocated to characters to be prepared under the raw data mode and coincident lengths to be found under the reproduction mode, similar to the apparatus of claim 8. The splay-tree decoder 133 decodes a first code provided by the extractor 132 according to the code book 131. According to the determination of the decision unit 134, the character string decompressing unit 135 operates. As a result, an LZSS code prepared under the corresponding coding mode is decompressed according to the number decoded from the first code. The LZSS code is decoded by a known decompressing process into an original character string.

The invention of claim 21 employs the code book 136 corresponding to the code book 113 of claim 9. The extractor 132 extracts a second code from an input code prepared under the reproduction mode. The splay-tree decoder 137 decodes the second code according to the code book 136 into at least a part of the address of a matching character string. In this way, this invention decompresses an LZSS code from a code provided by the apparatus of claim 9, and an original character string from the LZSS code according to a known decompressing process.

The invention of claim 22 employs the code book 141 containing consecutive numbers allocated to characters to be prepared under the raw data mode and at least a part of each address to be found under the reproduction mode, similar to the apparatus of claim 10. The splay-tree decoder 142 decodes a first code provided by the extractor 132 according to the code book 141. According to the determination made by the decision unit 134, the character string decoder 143 operates. As a result, an LZSS code prepared under the mode determined is obtained according to a number decoded from the first code. The LZSS code is decoded into an original character string according to a known decompressing process.

The invention of claim 23 employs the code book 144 corresponding to the code book 117 of claim 11. The extractor 132 extracts a second code from an input code prepared under the reproduction mode. The splay-tree decoder 145 decodes the second code according to the code book 144 into a coincident length. In this way, an LZSS code is restored from a code provided by the apparatus of claim 11. The LZSS code is decoded into an original character string according to a known decompressing process.

The invention of claim 24 employs the code books 151 and 152 corresponding to the code books 121 and 122 of the apparatus of claim 12. The extractor 132 extracts a first code from an input code prepared under the raw data mode. The splay-tree decoder 153 decompresses a number indicating the higher part of a character from the first code. The extractor 154 extracts a second code. The splay-tree decoder 155 selects, in the code book 152, a tree of codes corresponding to the higher part of the character indicated by the number. The selected tree of codes is used to decompress the lower part of the character from the second code. According to a mode determined by the decision unit 134, the character string decompressing unit 156 combines the higher part and lower part of the character together and decompressed an original character. In this way, an LZSS code is decompressed from a code provided by the apparatus of claim 12, and the LZSS code is decoded into an original character string according to a known decompressing process.

Embodiments of the present invention will be explained in detail with reference to drawings.

Figure 7:
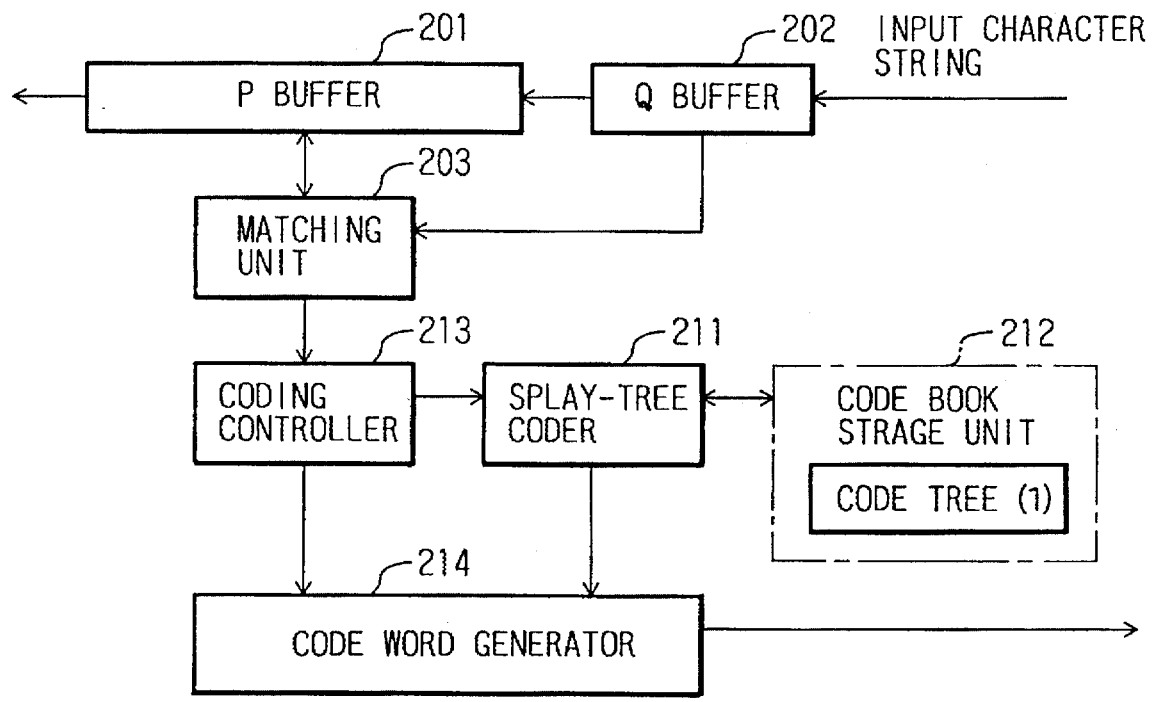
FIG. 7 shows a data compression apparatus according to claim 8.

FIG. 7 shows the apparatus for compressing data specified in claim 8.

The apparatus of claim 8 has, instead of the coder 501 of the data compressing apparatus of the prior art of FIG. 22, a splay-tree coder 211, a code book storage unit 212, a coding controller 213, and a code word generator 214. The coding controller 213 controls the splay-tree coder 211 and code word unit 214 according to a retrieved result provided by a matching unit 203, to code an input character string.

Characters and coincident lengths expected to occur are provided with different codes in advance, which are registered as leaves of a binary tree (hereinafter referred to as the tree (1)). The tree (1) is stored in the code book storage unit 212.

Figure 8:
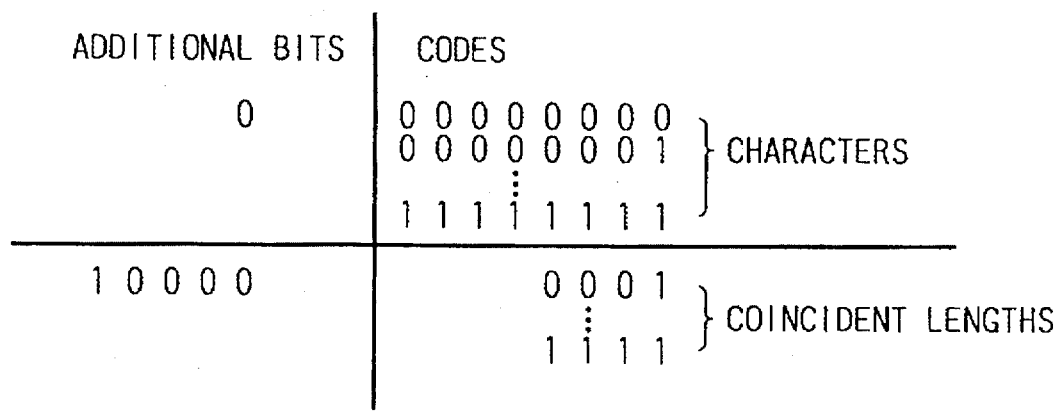
FIG. 8 shows examples of codes.

In FIG. 8, each character is represented by 8 bits. A bit of "0" is added to the head of each 8-bit character. Each coincident length is represented by 4 bits. A bit string of "10000" is added to each 4-bit coincident length. These 9-bit symbols are prepared for all characters and coincident lengths. Each of the symbols is provided with a code, and the codes are registered in the tree (1). The symbols may be a series of numbers corresponding to the characters and coincident lengths, so that the tree (1) corresponds to the code book 111. The bit strings of the symbols may be registered as they are as initial codes.

In FIG. 7, the splay-tree coder 211 corresponds to the splay-tree coding means 112 of claim 8. The splay-tree coder 211 receives a character or a coincident length as input data from the coding controller 213, refers to the code book storage unit 212 to find a code corresponding to the input data, and rearranges the tree (1) stored in the code book storage unit 212 according to the input data. In the following explanation, the operation of the splay-tree coder 211 is referred to as a splay-tree coding operation.

Figure 9:
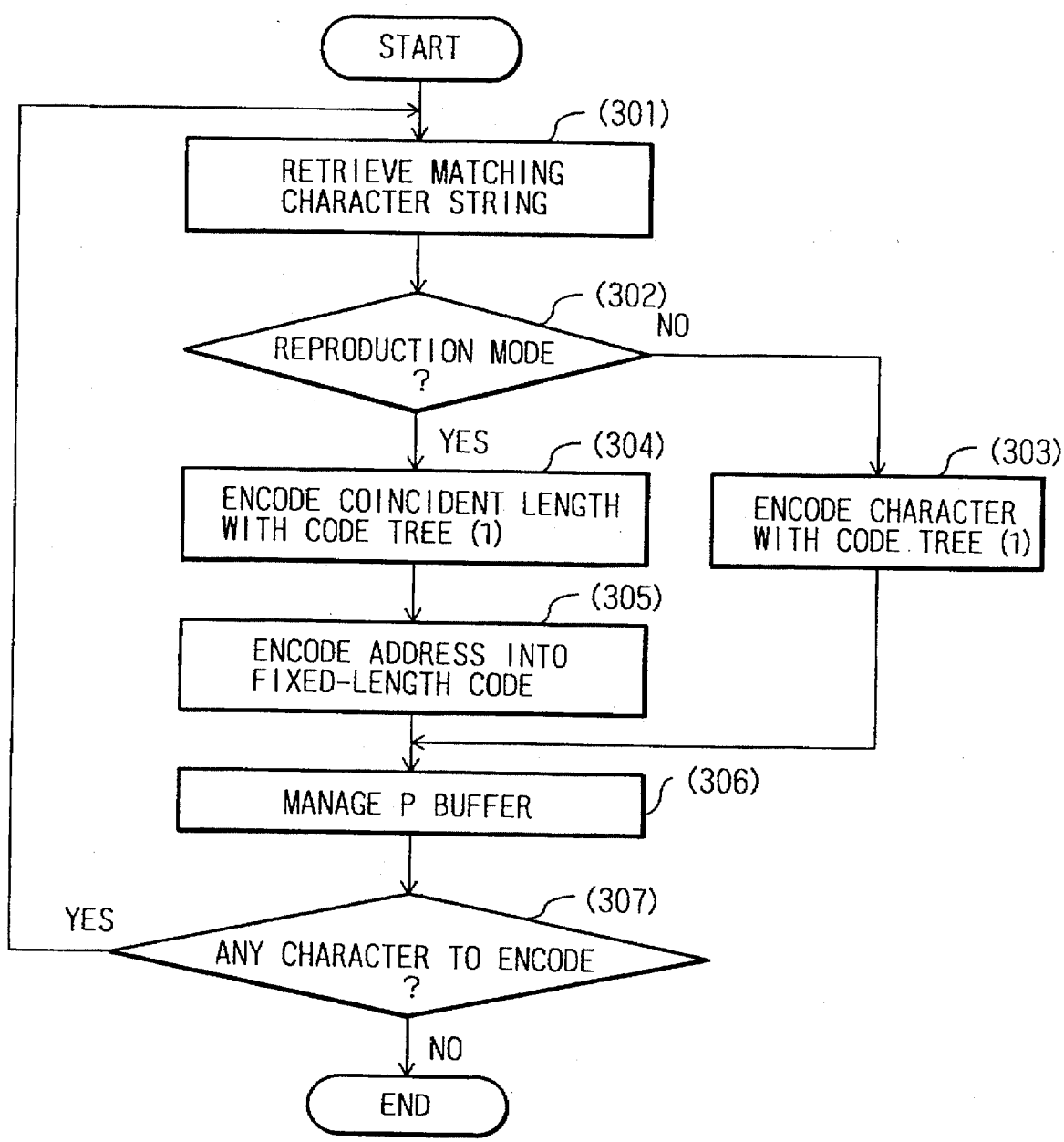
FIG. 9 is a flowchart showing a data compression operation.

FIG. 9 is a flowchart showing a data compression process.

In step 301, the matching unit 203 finds a matching character string in an input character string in a Q buffer 202 and in a character string stored in a P buffer 201. If a matching character string is found, it is transferred to the coding controller 213, and if not, a first character in the input character string is transferred as a matching character string to the coding controller 213.

In step 302, the coding controller 213 determines whether or not the matching character string must be coded under a reproduction mode according to whether or not the matching character string contains two or more characters.

If the step 302 determines that the length is less than two characters, the coding controller 213 selects a raw data mode to send the first character in the Q buffer 202 to the splay-tree coder 211, and instructs the code word generator 214 to provide a code word for the raw data mode.

In step 303, the splay-tree coder 311 converts the matching character string into a splay-tree code according to the tree (1) stored in the code book storage unit 212. The splay-tree code (hereinafter referred to as the splay-tree code (1)) is transferred to the code word generator 214. The code word generator 214 provides the splay-tree code (1) as a code word for the raw data mode, as shown in FIG. 10A. Then, step 306 is carried out.

If the step 302 determines that the coincident length is equal to or longer than two characters, the coding controller 213 selects the reproduction mode, which is informed to the code word generator 214. The coincident length is transferred to the splay-tree coder 211. The address of the coincident character string in the P buffer 201 is transferred to the code word generator 214.

In step 304, the splay-tree coder 211 converts the coincident length into a splay-tree code according to the tree (1) and transfers it to the code word generator 214. In step 305, the code word generator 214 forms a fixed length code for the address of the matching character string in the P buffer 201. As shown in FIG. 10A, the code word generator 214 adds the fixed-length code to the splay-tree code (1) provided by the splay-tree coder 211, to form a code word for the reproduction mode. In the step 305, the code word generator 214 uses the received address as it is as the fixed-length code and adds it to the splay-tree code (1), to form the code word.

In the step 306, the character string in the Q buffer 202 that has been coded is transferred to the P buffer 201, and an old character string in the P buffer 201 is discarded. Step 307 checks to see if there is a character string to code. If there is, the step 301 is repeated to process the character string, and if not, the data compression process ends.

In this way, the splay-tree coder 211 codes a first character in the Q buffer 202 into a splay-tree code under the raw data mode, and under the reproduction mode, codes a coincident length provided by the matching unit 203 into a splay-tree code. Namely, the splay-tree coder 211 operates according to instructions from the coding controller 213, to achieve the data compression methods of claims 2 and 3.

At the start of the coding process, the frequency of occurrence of the raw data mode is high. In this case, the length of a code of a given character is shortened depending on the character's frequency of occurrence. When the frequency of occurrence of the reproduction mode increases, the length of a code of a given coincident length is shortened depending on the frequency of occurrence of the coincident length.

This embodiment codes character symbols and coincident length symbols into splay-tree codes. Namely, this embodiment compresses data by utilizing the frequencies of occurrence of characters and coincident lengths, to thereby improve the efficiency of compression of input character strings irrespective of the frequencies of occurrence of coincident character strings.

In FIG. 8, a first bit of a bit string representing a character or a coincident length specifies the raw data mode or the reproduction mode. Namely, the present invention compresses information corresponding to an identification flag of the prior art into a variable-length code.

The present invention obtains a fixed-length code according to the LZSS coding method and further codes the same into a splay-tree code, to cover the disadvantage of the LZSS coding method and improve coding efficiency. The splay-tree coder 211 rearranges the code book in the unit 212 to halve the length of a code corresponding to a number, thereby efficiently compressing input data.

The present invention utilizes the statistical characteristics of input data. When the frequency of occurrence of the raw data mode is high, the present invention compresses input data by utilizing an unevenness in the frequencies of occurrence of characters in input data. When the frequency of occurrence of the reproduction mode is high, the present invention achieves a high compression ratio by utilizing the redundancy of character strings in input data. The present invention realizes a high compression ratio even just after the start of a coding process, or even with respect to input data of low redundancy irrespective of the statistical characteristics of the input data and progress in the coding process.

In FIG. 8, the most significant bit of a number corresponding to a character may be "1" instead of "0," and the most significant bit of a number corresponding to a coincident length may be "0" instead of "1." In this case, consecutive numbers are firstly allocated to coincident lengths and then to characters.

When finding a coincident character string in the P buffer 201, it is usually found in the vicinity of a character string to code.

For example, when a character string is sequentially transferred from the Q buffer 202 into a hexadecimal address "000H" of the P buffer and when an old character string is discarded from a hexadecimal address "FFFH" of the P buffer 201, a younger address in the P buffer 201 is usually found as a coincidence start position.

This tendency may be used to obtain a high compression ratio.

For example, the code book storage unit 212 of FIG. 7 may store, in addition to the tree (1), a code book (2) for registering the addresses of the P buffer 201 corresponding to coincidence start positions. In this case, the coding controller 213 specifies one of the trees for the splay-tree coder 211 to code input data.

Although a coincidence start position is usually found in the vicinity of a coding character, the position fluctuates. Namely, coincidence start positions do not occur at a specific address. It is, therefore, advantageous to consider the higher part of each address and code them into variable-length codes according to the frequencies of occurrence of matching-character-string finding positions in the P buffer 201. For example, the higher 4 bits of each address are coded into splay-tree codes, to search 16 corresponding areas in the P buffer 201 for a given character string. This results in utilizing an unevenness in the frequencies of occurrence of coincidence start positions in the P buffer 201.

Accordingly, the code book storage unit 212 stores the binary tree (2) containing codes corresponding to, for example, higher four bits of each address of the P buffer 201.

In this case, the coding controller 213 instructs the splay-tree coder 211 to select one of the trees. The code table storage unit 212 functions as the code table 111 of claim 8 and the code table 113 of claim 9. The splay-tree coder 211 serves as the splay-tree coding means 112 of claim 8 and the splay-tree coding means 114 of claim 9.

Figure 11:
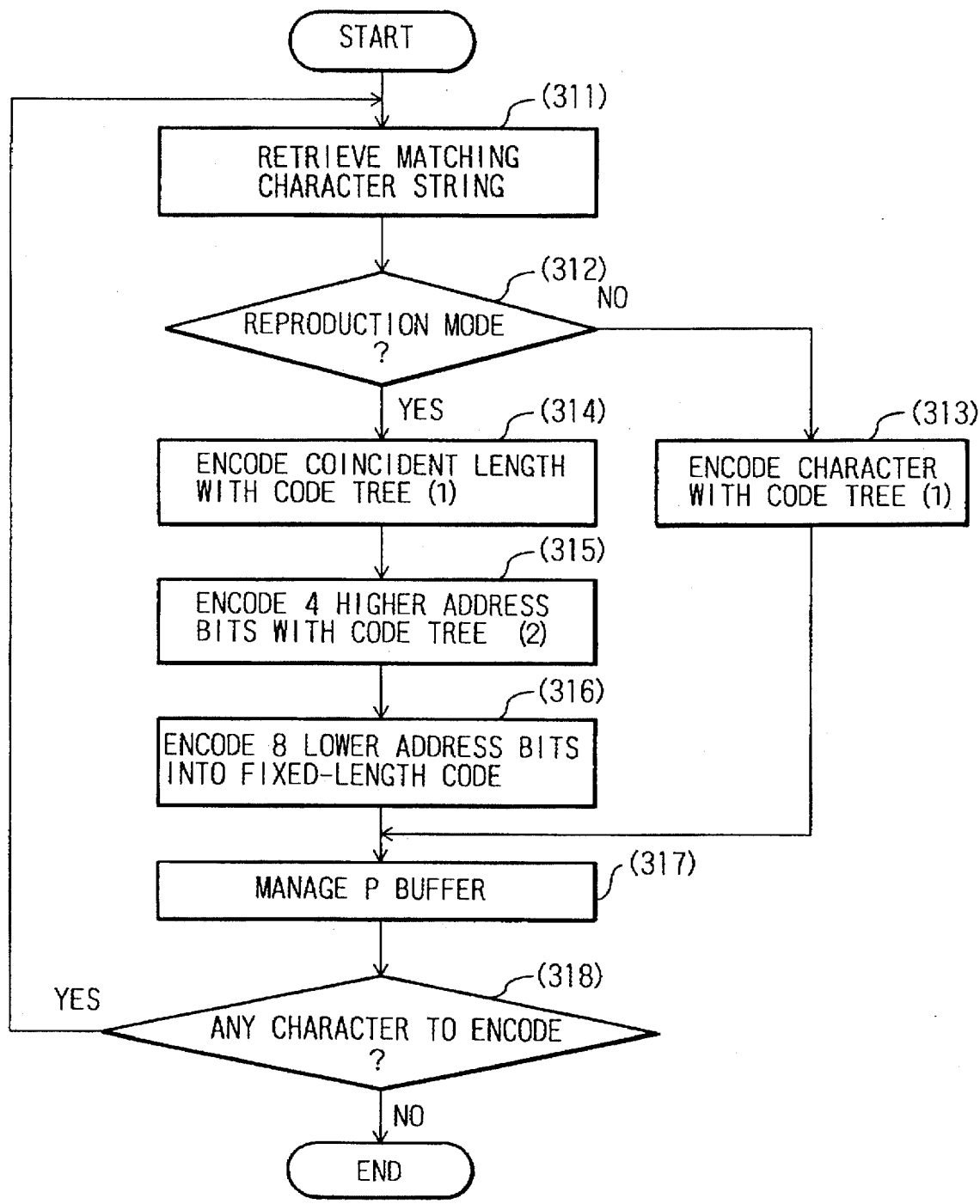
FIG. 11 is a flowchart showing a data compression operation.

FIG. 11 is a flowchart showing the data compression operation of the data compressing apparatus of claim 9.

Steps 311 and 312 find a coincident character string in the P buffer 201 and determine a coding mode, similar to the steps 301 and 302 explained above. If the step 312 determines that it is the raw data mode, step 313 provides a splay-tree code (1) corresponding to an input character, as shown in FIG. 10B. Then, step 317 is carried out. If the step 312 determines that it is the reproduction mode, the coding controller 213 specifies the tree (1) for the splay-tree coder 211 to code a coincident length. The splay-tree coder 211 provides the code word generator 214 with a splay-tree code (1) according to the tree (1), in step 314.

In step 315, the coding controller 213 specifies the tree (2) for the splay-tree coder 211 to code the higher four bits of the start address of the matching character string. The splay-tree coder 211 provides the code word generator 214 with a splay-tree code (2) according to the tree (2).

At this time, the coding controller 213 sends the lower 8 bits of the address to the code word generator 214, to prepare a code word under the reproduction mode.

In step 316, the code word generator 214 prepares a fixed-length code for the lower 8 bits of the address. The splay-tree code (1), splay-tree code (2), and fixed-length code are successively combined together, to form a code word for the reproduction mode, as shown in FIG. 10B.

Step 317 manages the P buffer 201 and Q buffer 202 similar to the step 306. Step 318 determines whether or not there is an input character string to encode. If there is, the step 311 is repeated to process the character string.

Similar to the embodiment of claim 8, this embodiment utilizes an unevenness in the frequencies of occurrence of the raw data mode and reproduction mode due to an unevenness in the probabilities of occurrence of characters and coincident lengths and due to progress in the coding process, to thereby increase a compression ratio. In addition, this embodiment codes the higher four bits of an address of the P buffer 201 corresponding to a coincidence start position into a splay-tree code, to utilize a fluctuation in the position of a matching character string, thereby improve a compression ratio.

This embodiment eliminates redundancy of the LZSS coding method that codes a coincidence start position into a fixed-length code. In particular, this embodiment achieves great compression effect just after the start of a coding process or when input data is short. This is because an area for large address numbers is empty in such a case and because coincidence start positions are limited to an area including small address numbers in the P buffer 201. It is expected, therefore, that a code of a very small number of bits is allocated to an area in question.

It is possible to code all addresses of the P buffer 201 into splay-tree codes.

In this case, the code book storage unit 212 stores a binary tree (3) that contains codes corresponding to 12-bit addresses. The coding controller 213 transfers a coincidence start position provided by the matching unit 203 to the splay-tree coder 211, which codes the same according to the tree (3). When the reproduction mode is specified, the code word generator 214 successively combines splay-tree codes provided by the splay-tree coder 211 for a coincident length and a coincidence start address, to form a code word.

This code word for the reproduction mode has a splay-tree code (3) instead of the fixed-length start position of the code word of FIG. 10A, to specify a whole address in the P buffer 201.

It is possible to employ a combination of the higher bits of a coincidence start position instead of a coincident length, and characters for the raw data mode.

For example, the coding controller 213 of FIG. 7 provides the splay-tree coder 211 with the higher k bits of a coincidence start position instead of a coincident length, to code it with a proper tree. Thereafter, another tree is specified to code a coincident length.

In this case, the code book storage unit 212 stores a binary tree (4) containing symbols corresponding to characters and the higher k bits of each coincidence start position, and a binary tree (5) containing codes corresponding to coincident lengths. The tree (4) corresponds to the code book 115 of claim 10, and the tree (5) corresponds to the code book 117 of claim 11.

Combinations of higher four bits of a coincidence start position are the same as combinations of bits representing a coincident length. Accordingly, the initial codes registered in the tree (4) are determined in the same manner as the tree (1). Namely, a bit string of "10000" is added to the higher four bits of a coincidence start position, and a bit of "0" is added to each character, to form new symbols. The bit strings of the symbols are registered as initial codes. Initial codes registered in the tree (5) are bit strings representing coincident lengths.

In step 314 of a flowchart shown in FIG. 11, the coding controller 213 instructs the splay-tree coder 211 to code the higher four bits of an address according to the tree (4), and in step 315, the coding controller 213 instructs the splay-tree coder 211 to code a coincident length according to the tree (5). Namely, the step 314 codes the higher four bits of an address into a splay-tree code (4) according to the tree (4), and the step 315 codes a coincident length into a splay-tree code (5) according to the tree (5).

In this way, the splay-tree coder 211 and code book storage unit 212 operate in response to instructions from the coding controller 213, to realize the splay-tree coding means 116 of claim 10 and the splay-tree coding means 118 of claim 11. This embodiment codes a character under the raw data mode and a part of a coincidence position under the reproduction mode into a variable-length code. This embodiment also codes a coincident length under the reproduction mode into a variable-length code.

As shown in FIG. 10D, the code word generator 214 provides a splay-tree code (4) for the raw data mode according to an input character and the tree (4), and for the reproduction mode, a splay-tree code (4) corresponding to a part of a coincidence start position, a code for the lower 8 bits of the coincidence start position, and a splay-tree code (5) corresponding to a coincident length.

Consequently, the data compression apparatus of this embodiment achieves the data compression method of claim 2 and the data compression method of claim 4. Similar to the data compression apparatus of claim 8, this data compression apparatus covers the disadvantage of the LZSS coding method and improves a compression ratio irrespective of the statistical characteristics of input data or an unevenness in the frequencies of occurrence of the raw data mode and reproduction mode during a coding process.

It is possible to combine characters to be coded under the raw data mode with all addresses of coincidence start positions to be found under the reproduction mode.

For example, the coding controller 213 of FIG. 7 sends the whole address and length of a coincidence start position in the P buffer 201 to the splay-tree coder 211 to code them according to proper trees.

The code book storage unit 212 stores a tree (6) containing symbols corresponding to all characters and the addresses of coincidence start positions, as well as a tree (5) containing coincidence lengths. The tree (6) corresponds to the code book 115, similar to the tree (4).

In this case, bit-length-adjusting bits of "0000" and an identification flag of "0" are added to each character bit string, and an identification flag of "1" is added to each address bit string, to form character and address symbols that form the tree (6). The tree (6) is stored in the code book storage unit 212. Initial codes for these symbols may be the bit strings of the symbols as they are, similar to the tree (1).

Figure 12:
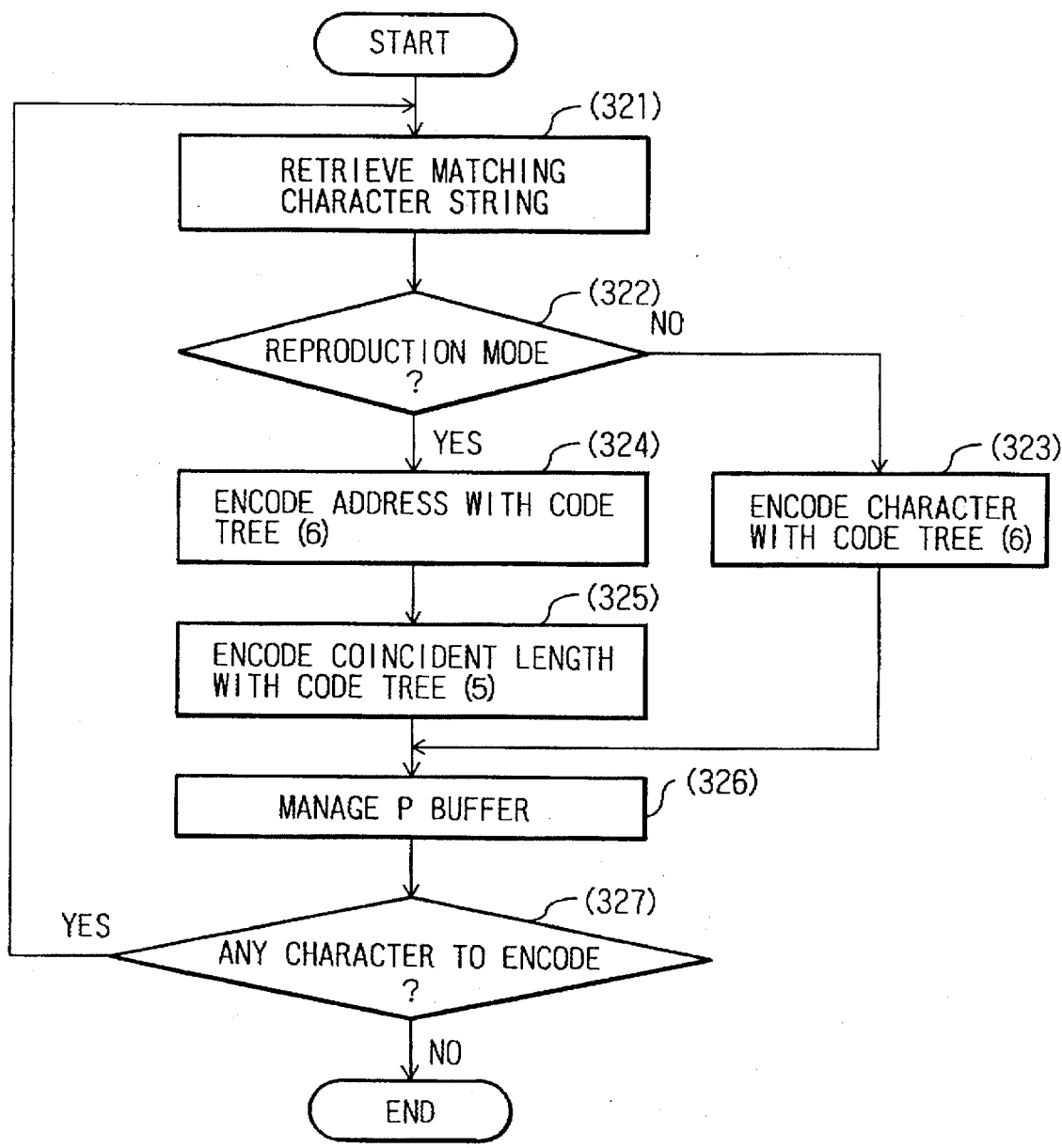
FIG. 12 is a flow chart showing a data compression operation.

FIG. 12 is a flowchart showing this data compression process.

Steps 321 and 322 find a matching character string and determine a coding mode, similar to the steps 301 and 302 of FIG. 9.

If the step 322 determines that it is the raw data mode, the coding controller 213 instructs the splay-tree coder 211 to code the input character into a splay-tree code (6) according to the tree (6) in step 323. The code word generator 214 provides a code word consisting of the splay-tree code (6) alone as shown in FIG. 10E.

If the step 322 determines that it is the reproduction mode, the coding controller 213 instructs the splay-tree coder 211 to code the whole address of a coincidence start position in the P buffer 201 into a splay-tree code (6) according to the tree (6) in step 324. In step 325, the splay-tree coder 211 codes a coincidence length into a splay-tree code (5) according to the tree (5). The code word generator 214 combines the splay-tree codes (6) and (5) provided by the steps 324 and 325 into a code word of FIG. 10E.

Step 326 manages the buffers similar to the step 306. Step 327 determines whether or not there is a character string to code. If there is, the step 321 is repeated to code the character string.

This embodiment encodes LZSS codes all into variable-length codes. Accordingly, if there is a large unevenness in the frequencies of occurrence of characters, coincidence start positions, and coincident lengths, a compression ratio will be greatly improved. Actually, however, there is no large unevenness in the frequencies of occurrence of coincidence start positions, so that it is advantageous to code a part (for example, higher four bits) of each address instead of the whole thereof into a splay-tree code.

Image data such as data of a natural image involves gradation. This kind of data include noise components. Accordingly, the gradation levels of adjacent pixels rarely agree with each other although they are close to each other. It is very difficult, therefore, to detect a position where a pattern of gradation levels repeats.

This is because lower bits of image data fluctuate due to the noise components. If higher bits of the image data are compared with one another, repetitions will be found at high probability. Namely, in image data, broad changes regularly appear in gradation levels, and therefore, the image data will be compressed according to the regularity.

A method of compressing input data according to such broad changes will be explained.

In the data compression apparatus of claim 12, the coding controller 213 of FIG. 7 divides, under the raw data mode, an input character into higher and lower parts and successively sends them to the splay-tree coder 211, which codes them into splay-tree codes according to different trees.

The code book storage unit 212 stores a tree (7) containing codes corresponding to symbols representing all combinations of the higher bits of a character and all coincident lengths. The code book storage unit 212 also stores 16 trees (8)0 to (8)15 containing codes representing combinations of the lower four bits of the character corresponding to the combinations of the higher four bits of the character, respectively, and a tree (2) containing codes corresponding to the higher four bits of each coincidence start position. The tree (7) corresponds to the code book 121, and the trees (8)0 to (8)15 correspond to the code book 122.

The tree (7) stores, as initial codes, bit strings representing symbols each formed by adding an identification flag of "0" to the higher four bits of a character and symbols formed by adding an identification flag of "1" to each four-bit coincident length. The tree (7) is a binary tree and is stored in the code book storage unit 212. Similarly, each of the 16 trees (8)0 to (8)15 stores the lower four bits of each character as an initial code.

Figure 13:
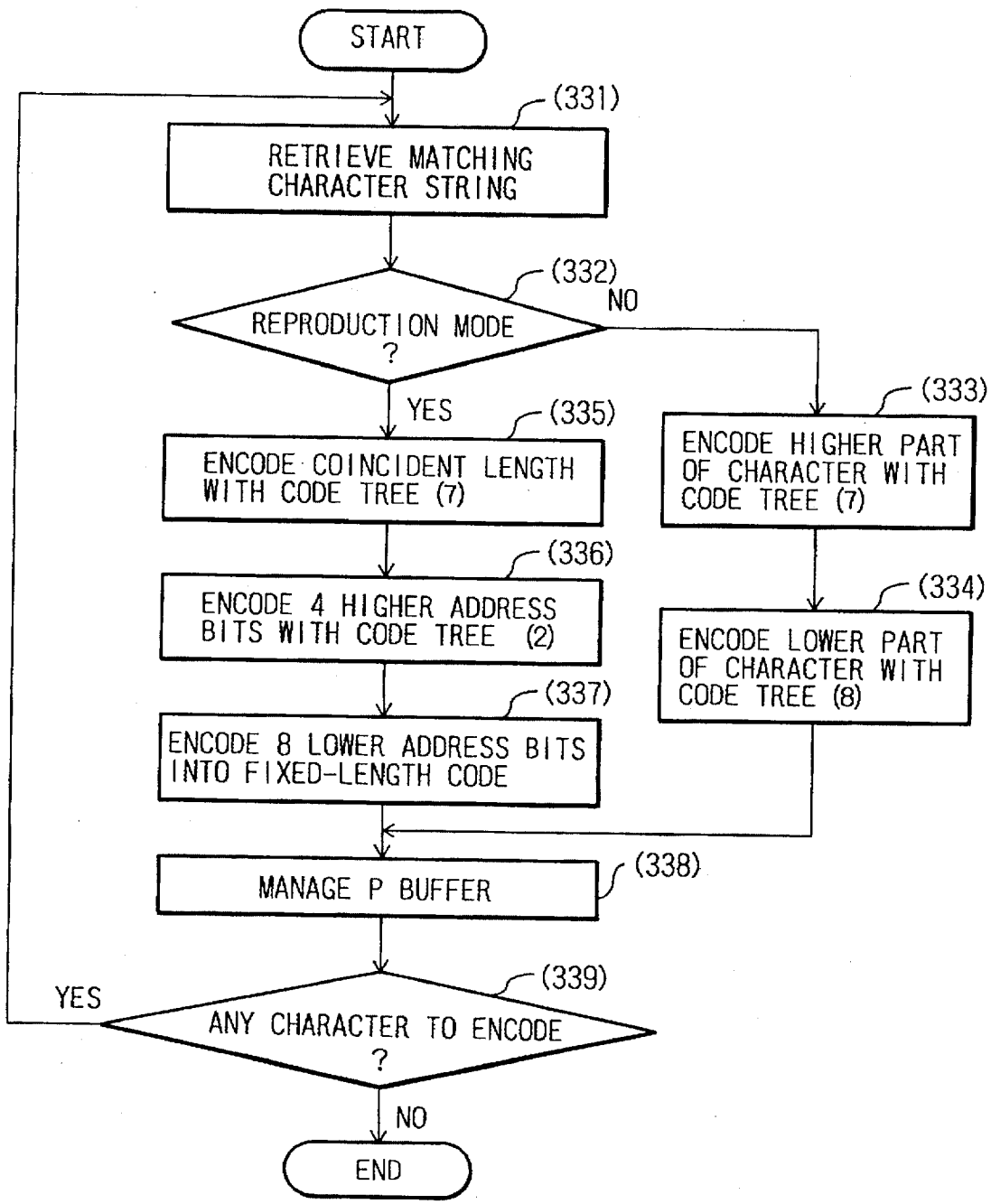
FIG. 13 is a flowchart showing a data compression operation.

FIG. 13 is a flowchart showing the data compressing operation of the apparatus of claim 12.

Steps 331 and 332 retrieve a matching character string and determine a coding mode, similar to the steps 301 and 302 of FIG. 9.

If the step 332 determines that it is the raw data mode, the coding controller 213 instructs the splay-tree coder 211 to code the higher four bits of the input character into a splay-tree code according to the tree (7) in step 333 and to code the lower four bits of the input character into a splay-tree code according to a corresponding one of the trees (8)0 to (8)15 in step 334.

The code word generator 214 successively combines the splay-tree codes (7) and (8) provided by the splay-tree coder 211, to form a code word for the raw data mode as shown in FIG. 10F.

If the step 332 determines that it is the reproduction mode, the coding controller 213 instructs the splay-tree coder 211 to code a coincident length into a splay-tree code according to the tree (7) in step 335, and to code the higher four bits of an address according to the tree (2) in step 336. The code word generator 214 converts the lower eight bits of the address into a fixed-length code in step 337 and successively combines the fixed-length code and the splay-tree codes (7) and (2) obtained in the steps 335 and 336, to provide a code word for the reproduction mode as shown in FIG. 10F.

Step 338 manages the buffers similar to the step 305. Step 339 determines whether or not there is a character string to code. If there is, the step 331 is repeated to code the character string.

In this way, the splay-tree coder 211 carries out a coding process according to the tree (7) in response to an instruction from the coding controller 213. The splay-tree coder 211 realizes the splay-tree coder 123 and splay-tree coding means 124 of claim 12, to convert a part of a code in the raw data mode and a part of a code in the reproduction mode into variable-length codes.

The data compression apparatus of this embodiment thus achieves the data compression method of claim 7. The higher bits of each character in the raw data mode are combined with coincident lengths in the reproduction mode, to form splay-tree codes, which are combined with LZSS codes. This embodiment utilizes an unevenness in the frequencies of occurrence of matching character strings and an unevenness in the frequencies of occurrence of coincident lengths and coincidence start positions, to improve a compression ratio. Even if the higher part of an input character string involves redundancy, this embodiment utilizes the redundancy, to compress the input data. Accordingly, this embodiment realizes high compression efficiency not only on text data but also on natural images that contain noise components.

If each pixel of image data is handled as a character and coded according to the LZSS coding method, almost all input characters will be coded under the raw data mode. Accordingly, when compressing image data, a compression ratio under the raw data mode is important.

As explained above, the higher bit part of image data includes redundant information. The background of a natural image involves substantially uniform gradation. In this case, the higher bit parts of the image are mostly identical to one another. Accordingly, codes corresponding to the higher bits will be very short to achieve high compression efficiency.

With respect to the higher part of a character, the splay-tree coder 211 selects a corresponding tree (8) in the code book storage unit 212 and carries out a coding process according to the tree (8). The lower four bits of each input character is coded into a variable-length code according to a subordination between the higher four bits and lower four bits of the input character. This embodiment improves a compression ratio even on input character strings such as letters of the alphabet that involve an unevenness in the frequencies of occurrence of 8-bit characters.

Instead of coincident lengths, the higher part of the address of each coincidence start position may be combined with the higher part of each input character and coded into a splay-tree code.

For example, the coding controller 213 of FIG. 7 sends the higher four bits of an address in the P buffer 201 to the splay-tree coder 211 under the reproduction mode, and a coincident length to the splay-tree coder 211.

Instead of the tree (7), a tree (9) containing codes corresponding to symbols representing the higher four bits of each input character and the higher four bits of each address is prepared and stored in the code book storage unit 212. The tree (9) corresponds to the code book 121. Also, a tree (5) for coincident lengths is prepared instead of the tree (2) for the higher four bits of each address and is stored in the code book storage unit 212.

In this case, the coding controller 213 instructs the splay-tree coder 211 to carry out a coding process according to the tree (9), to realize the function of the splay-tree coding means 123 of claim 12.

Namely, the step 333 Of FIG. 13 codes the higher four bits of an input character into a splay-tree code according to the tree (9). The step 336 codes the four bits of an address, instead of a coincident length, into a splay-tree code according to the tree (9). The step 337 codes a coincident length into a splay-tree code according to the tree (4).

As shown in FIG. 10G, the code word generator 214 combines the splay-tree code (9), instead of the splay-tree code (7), obtained according to the tree (9) with a splay-tree code (8), to form a code word for the raw data mode. The code word generator 214 combines the splay-tree code (9), the lower eight bits of the address, and a splay-tree code (5) together to provide a code word for the reproduction mode.

Under the raw data mode, this embodiment compresses an input character string according to the frequency of occurrence of the higher four bits of the input character, and in the reproduction mode, compresses the higher four bits of a coincident start position according to an unevenness in the distribution of coincident character string detection positions.

According to the above embodiments, a single splay-tree coder selects one of the code books according to information to code, to successively code each piece of information into a splay-tree code. It is possible to provide splay-tree coders and code book storage units for information of several kinds, respectively, and simultaneously operate these splay-tree coders.

Figure 14:
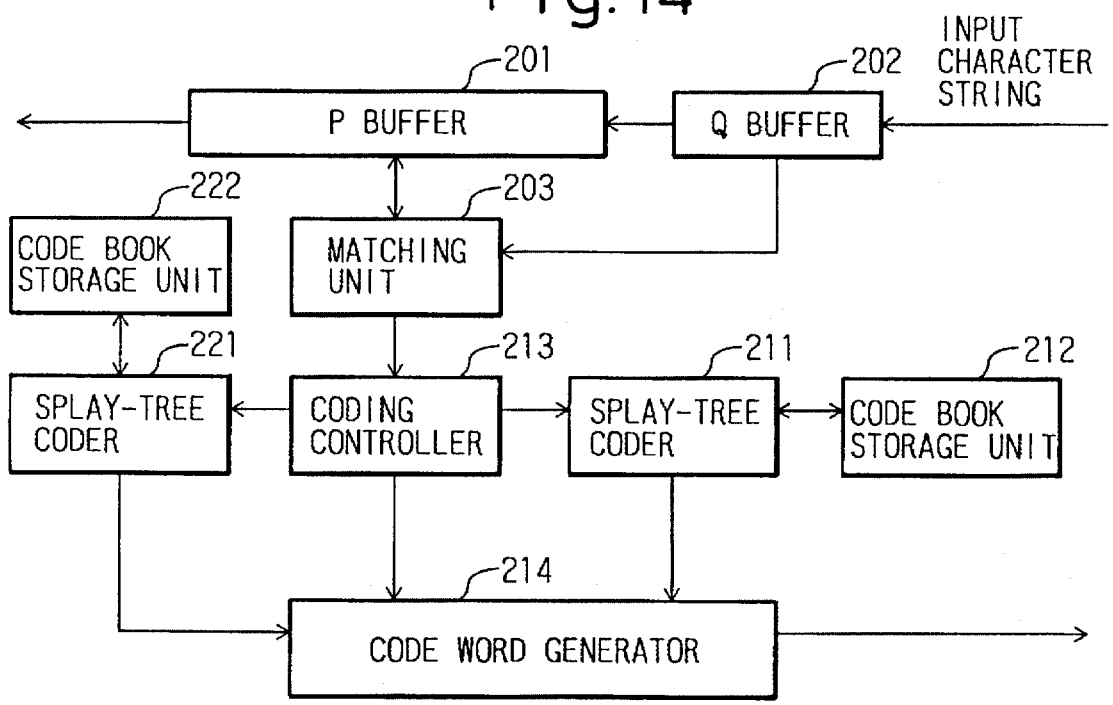
FIG. 14 shows a data compression apparatus according to claim 9.

FIG. 14 shows a data compression apparatus according to another embodiment of the present invention.

The data compression apparatus has two splay-tree coders 211 and 221 and a code word generator 214. A coding controller 213 sends an input character under the raw data mode and a coincident length under the reproduction mode to the splay-tree coder 211, and the higher four bits and lower eight bits of a coincidence start position to the splay-tree coder 221 and code word generator 214.

A code book storage unit 212 stores a tree (1) containing codes representing symbols corresponding to characters and coincident lengths. The splay-tree coder 211 carries out a coding process according to the tree (1), to realize the function of the splay-tree coding means 112 of claim 8. A code book storage unit 222 stores a code book (2) containing codes representing the higher four bits of each coincidence start position. The splay-tree coder 221 carries out a coding process according to the tree (2), to realize the function of the splay-tree coding means 114 of claim 9.

Under the raw data mode, only the splay-tree coder 211 operates, so that the code word generator 214 provides a splay-tree code corresponding to an input character. Under the reproduction mode, the splay-tree coders 211 and 221 simultaneously operate, so that the code word generator 214 combines a splay-tree code corresponding to a coincident length, a splay-tree code corresponding to the higher four bits of a coincidence start position, and the lower eight bits of the coincidence start position.

Simultaneously operating the splay-tree coders 211 and 221 shortens a coding time under the reproduction mode and improves a data compression speed.

Similarly, the data compression apparatuses of claims 10 to 12 are realized.

Methods of and apparatuses for decompressing original character strings from coded data provided by the data compression apparatuses mentioned above will be explained next.

Figure 15:
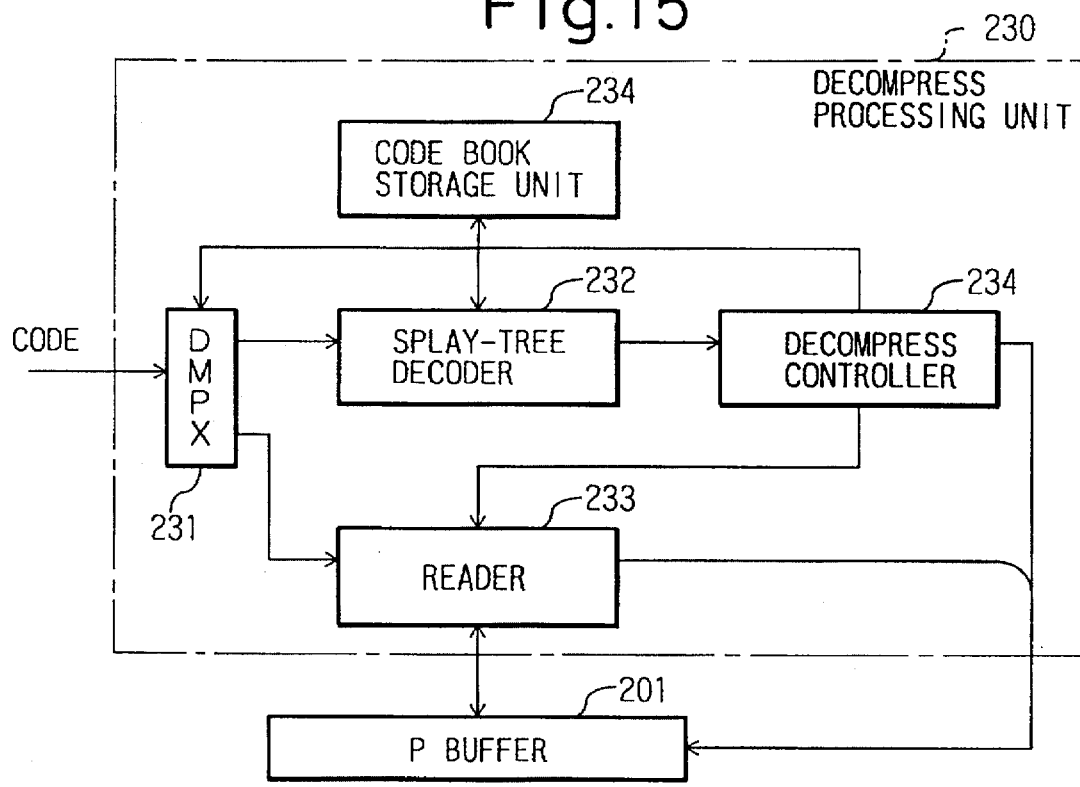
FIG. 15 shows a data decompressing apparatus according to claim 20.

FIG. 15 shows the data decompressing apparatus of claim 20.

This apparatus has a decompress processing unit 230 for decompressing character strings from code words according to a process opposite to the compression process mentioned above. The decompressed character strings are stored in a P-buffer 201 corresponding to the dictionary 104.

The decompress processing unit 230 has a demultiplexer (DMPX) 231 to be activated in response to a switching instruction, to decompose an input code word into components, which are sent to a splay-tree decoder 232 and a reader 233.

A code book storage unit 234 corresponds to the code book 131. Similar to the data compression apparatus of claim 8, the code book storage unit 234 stores a tree (1) containing codes representing symbols of all characters and coincident lengths. Similar to the data compression apparatus, the code book storage unit 234 stores, as initial codes representing the symbols, bit strings indicating the symbols.

The splay-tree decoder 232 decodes input splay-tree codes according to the tree (1) stored in the code book storage unit 234, to realize the function of the splay-tree decoding means 133 of claim 20, to provide a character under the raw data mode and a coincident length under the reproduction mode, as a corresponding symbol.

According to a decoded result provided by the splay-tree decoder 232, a decompressing controller 235 controls the demultiplexer 231 and reader 233, to decompress an original character string.

Figure 16:
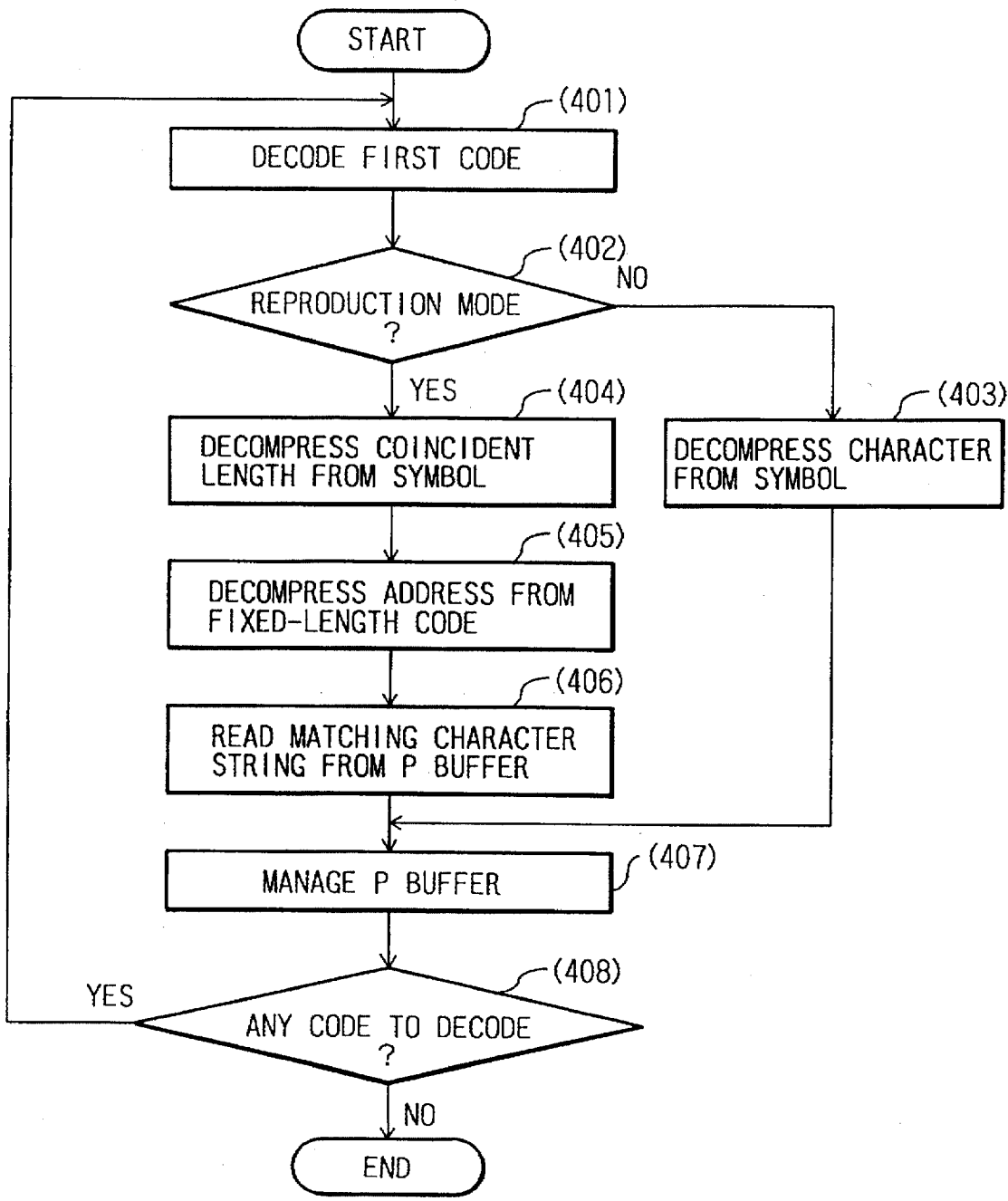
FIG. 16 is a flowchart showing a data decompressing operation.

FIG. 16 is a flowchart showing an operation of decompressing a character string from the code word of FIG. 10A.

In response to a switching instruction from the decompressing controller 235, the demultiplexer 231 sends a first splay-tree code to the splay-tree decoder 232, which decodes the same into a symbol according to the tree (1) in step 401.

In step 402, the decompressing controller 235 operates as the decision means 134 to determine whether or not the code word is for the reproduction mode according to the symbol provided by the step 401. The symbol is one of a series of numbers allocated to all characters and coincident lengths, and the most significant bit of each symbol for a character is 0, and that of each symbol for a coincident length is 1. Accordingly, the value of a bit string of the decoded symbol is compared with a value of 255, and the raw data mode is determined according to whether or not the decoded numeral is smaller than 255.

If the step 402 determines that it is the raw data mode, the decompressing controller 235 extracts the lower eight bits of the bit string of the decoded symbol and decodes them according to the LZSS coding method in step 403. The decoded character string is sent to the P buffer 201. Then, step 407 is carried out.

If the step 402 determines that it is the reproduction mode, the decompressing controller 235 determines that the input code word has been prepared under the reproduction mode, and steps 404 to 406 are carried out.

In the step 404, the decompressing controller 235 decompresses a coincident length from the decoded symbol. Since numbers that follow the numbers allocated to all characters are allocated to coincident lengths by providing an offset to the most significant bit, an original coincident length may be obtained by subtracting 256 from the value represented by the decoded symbol.

The decompressing controller 235 controls the demultiplexer 231, to extract the following 12-bit input string and decode the address of a coincidence start position of fixed length in step 405.

In this way, codes made by the LZSS coding method under the reproduction mode are decoded. In step 406, the reader 233 reads a character string out of the P buffer 201 according to the decompressed coincident length and coincidence start position, to thereby restore the character string corresponding to the input code word.

After the step 403 or step 406, the P buffer 201 accumulates the decoded character string and discards an old character string if required in step 407. Step 408 determines whether or not there is a code to decode. If there is, the step 401 is repeated to decode the code. If the step 408 determines that there is no code to decode, the decompressing process ends.

In this way, the decompressing controller 235 controls the demultiplexer 231 and reader 233 according to decoded results provided by the splay-tree decoder 232, to realize the functions of the extraction means 132 and character string decompressing means 135. This embodiment decodes a code word that is a mixture of a splay-tree code and a fixed-length code prepared by the LZSS coding method into an original character string.

If the data compression apparatus codes the address of a coincidence start position in the P buffer 201 into a fixed-length code, the step 405 may extract the fixed-length code and decodes the same into the coincidence start position.

In FIG. 15, the code book storage unit 234 may store a tree (2) corresponding to the higher four bits of each address, in addition to the tree (1). When receiving a code word prepared under the reproduction mode, the decompressing controller 235 may instruct the splay-tree decoder 232 to decode a second splay-tree code according to the tree (2).

In this case, the tree (2) stored in the code book storage unit 234 achieves the function of the code book 136 of claim 21. The splay-tree decoder 232 carries out a decoding process according to the tree (2) to realize the function of the splay-tree decoding means 137 of claim 21. Namely, this embodiment realizes the data decompressing apparatus of claim 21 to decompress an original character string from the code word of FIG. 10B.

Figure 17:
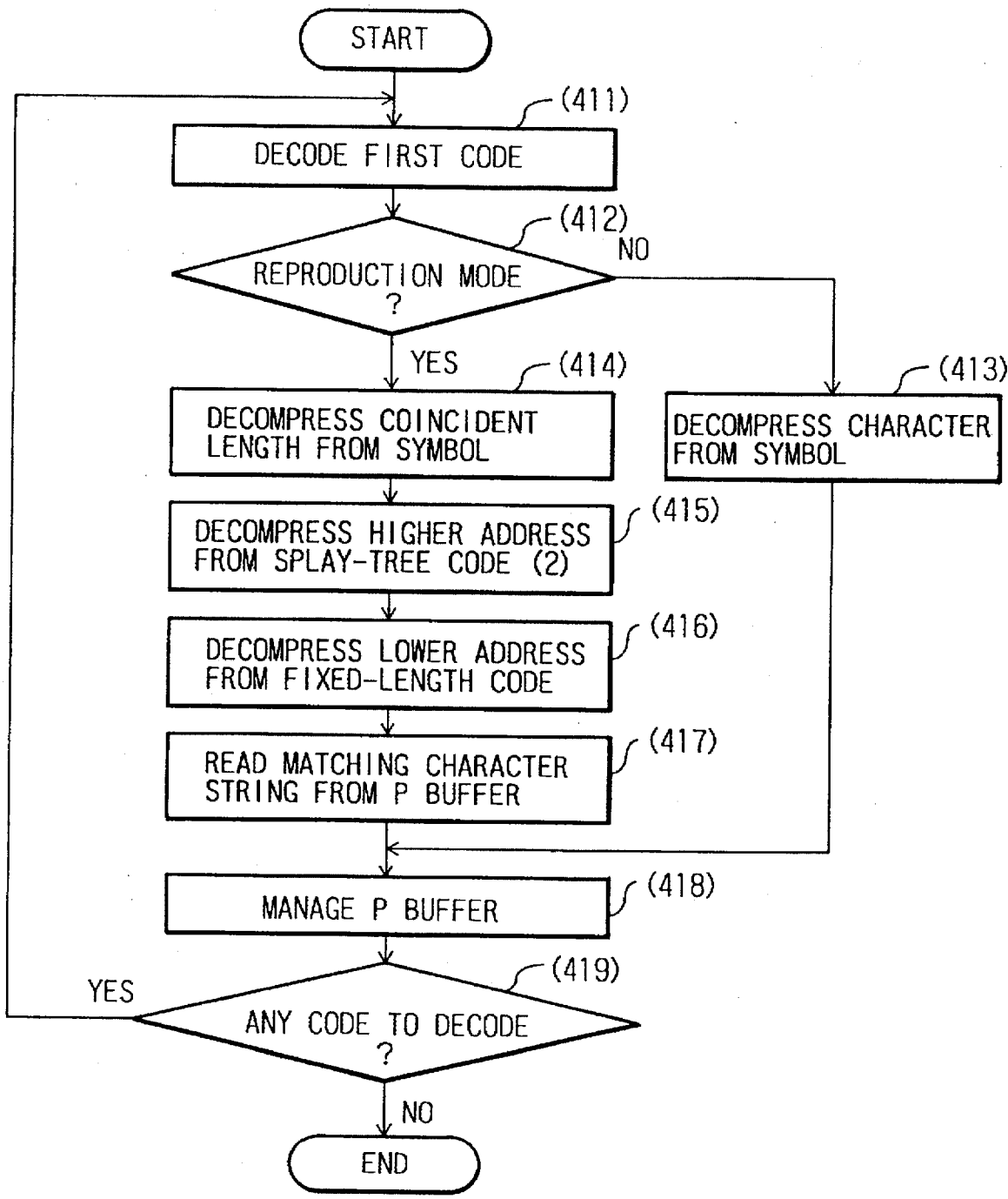
FIG. 17 is a flowchart showing a data decompressing operation.

FIG. 17 is a flowchart showing the data decompressing operation of the data decompressing apparatus of claim 21.

Step 411 decodes a first splay-tree code (1) according to the tree (1), similar to the step 401 of FIG. 16. Step 412 determines a coding mode according to the decoded result, similar to the step 402.

If the step 412 determines that it is the raw data mode, step 413 decompresses an original character, similar to the step 403. Then, step 418 is carried out.

If the step 412 determines that it is the reproduction mode, the decompressing controller 235 decompresses, in step 414, a coincident length from the code provided by the step 411 similar to the step 404, and sends the coincident length to the reader 233. The decompressing controller 235 instructs the splay-tree decoder 232 to decode the next code according to the tree (2).

The splay-tree decoder 232 decodes the second splay-tree code (2) that follows the splay-tree code (1), to decompress the higher four bits of an address in step 415. The decompressed bits are transferred to the reader 233 through the decompressing controller 235.

The decompressing controller 235 activates the demultiplexer 231. In step 416, an 8-bit string following the splay-tree code (2) is extracted and decoded into the lower eight bits of the address, which are transferred to the reader 233.

According to the address of the P buffer 201 obtained by adding the lower 8 bits provided by the step 416 to the higher four bits provided by the step 415 and the coincident length provided by the step 414, the reader 233 reads a character string out of the P buffer 201 as a decompressed character string in step 417.

Similar to the steps 407 and 408, the P buffer is managed and it is determined whether or not there is a code to decode. If there is, the step 411 is repeated to decode the code.

In this way, the decompressing controller 235 controls, according to the decoded result of a first splay-tree code, the demultiplexer 231, splay-tree decoder 232, and reader 233, to decode a code word that is a mixture of splay-tree codes (1) and (2) and the lower eight bits of an address prepared by the LZSS coding method into an original character string.

Instead of the tree (2), a tree (3) corresponding to the code book 136 containing codes of all addresses may be stored in the code book storage unit 234. When receiving a code word prepared under the reproduction mode, the decompressing controller 235 instructs the splay-tree decoder 232 to decode a second splay-tree code according to the tree (3).

In this case, in the step 405 of FIG. 16, the decompressing controller 235 instructs the splay-tree decoder 232 to decode the next splay-tree code according to the tree (3), and the decoded result is sent as the address of a coincidence start position to the reader 233.

This embodiment is capable of decompressing LZSS codes from a code word that is a mixture of splay-tree codes (1) and (3) as shown in FIG. 10C and then decompressing an original character string from the LZSS codes.

Figure 18:
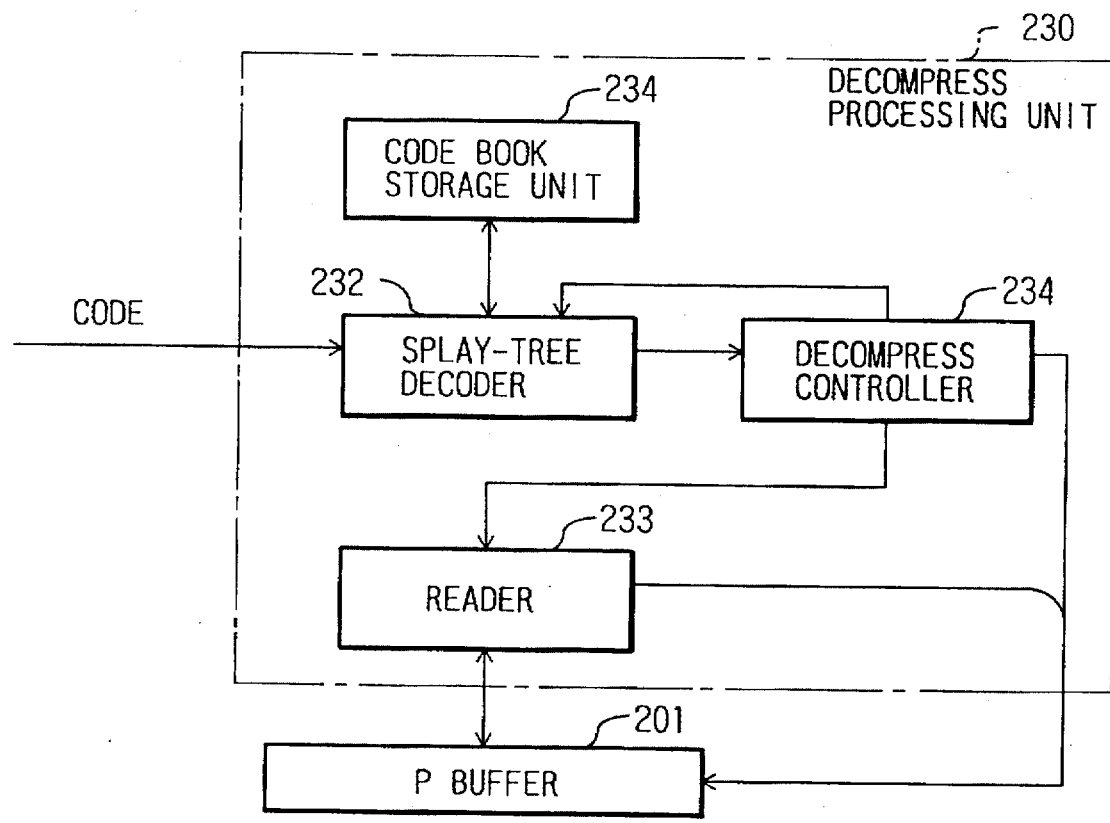
FIG. 18 shows a data decompressing apparatus according to claim 1.

In this case, the decompressing controller 235 instructs the splay-tree decoder 232 to carry out a decoding process according to the trees (1) and (3) that are properly switched from one to another, to thereby realize the function of the extraction means 132. Accordingly, the demultiplexer 231 is not needed. As shown in FIG. 18, codes are directly provided to the splay-tree decoder 232.

The code book storage unit 234 of FIG. 15 may store, instead of the tree (1), a tree (4) containing codes representing symbols corresponding to all characters and a part of each coincidence start position. The code book storage unit 234 also stores a tree (5). The decompressing controller 235 controls the elements of the decompress processing unit 230, to realize the data decompressing apparatus of claim 23.

The tree (4) corresponds to the code book 141 of claim 22, and the tree (5) corresponds to the code book 144 of claim 23.

Figure 19:
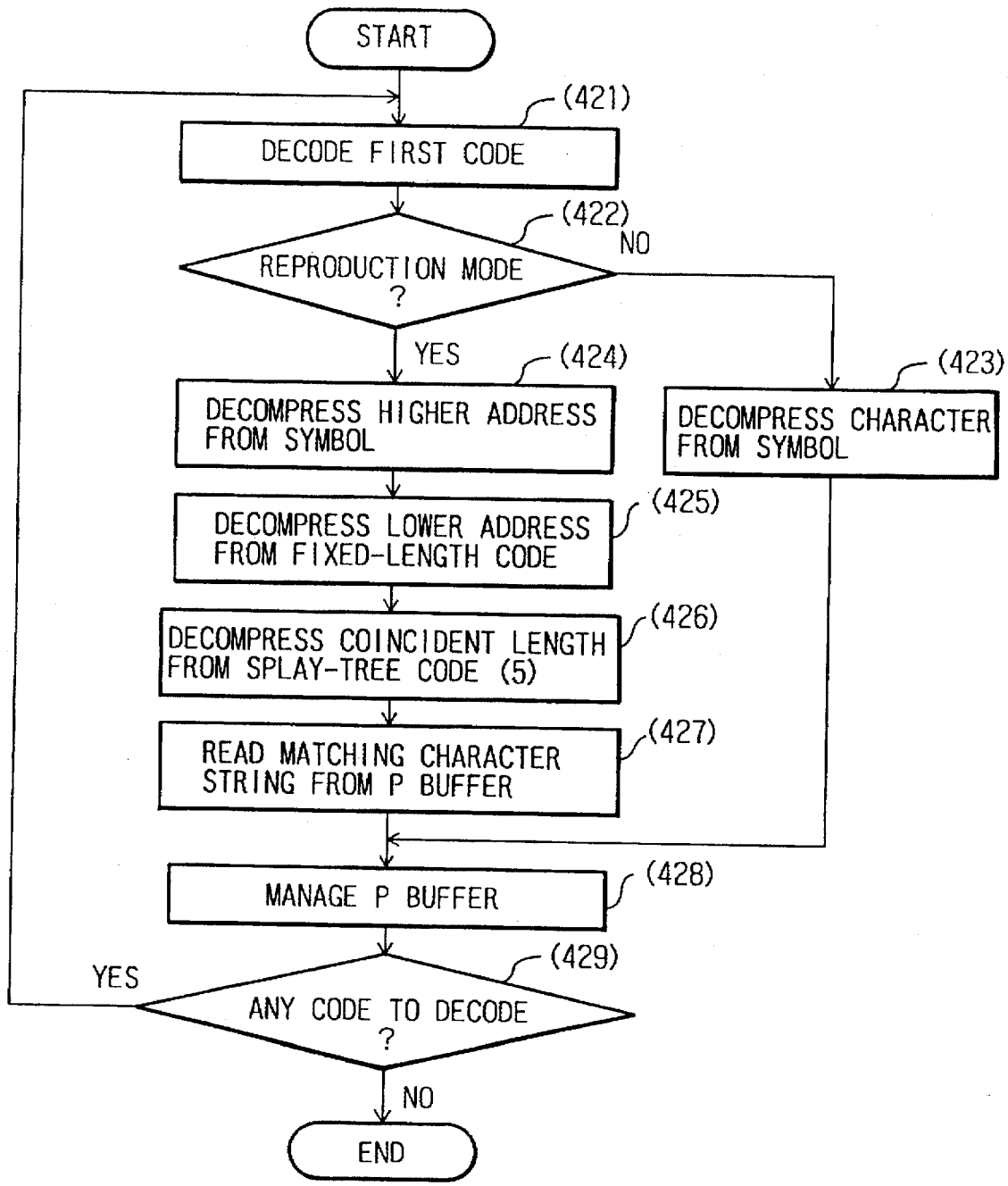
FIG. 19 is a flowchart showing a data decompressing operation.

FIG. 19 is a flowchart showing the data decompressing operation of the data decompressing apparatus of claim 23.

Step 421 decodes a first splay-tree code (4) similar to the step 401, and step 422 determines a coding mode according to the decoded result similar to the step 402. If the step 422 determines that it is the raw data mode, step 423 decompresses a character similar to the step 403. Then, step 428 is carried out.

If the step 422 determines that it is the reproduction mode, step 424 decompresses the higher four bits of an address according to a symbol decompressed from the splay-tree code (4) and sends the same to the reader 233. Step 425 controls the demultiplexer 231 to extract an 8-bit string and decompresses the lower eight bits of the address, similar to the step 416. In step 426, the decompressing controller 235 instructs the splay-tree decoder 232 to restore a coincident length from a second splay-tree code according to the tree (5). The coincident length is sent to the reader 233.

In step 427, the reader 233 reads a character string out of the P buffer 201 according to the LZSS codes provided by the steps 424 to 426.

Step 428 manages the buffers similar to the step 407. Step 429 determines whether or not there is a code to decode similar to the step 408. If there is, the step 421 is repeated to decode the code.

In this way, the decompressing controller 235 controls the demultiplexer 231, splay-tree decoder 232, and reader 233, to realize the functions of the extraction means 132 and splay-tree decoding means 142 of claim 22, and the functions of the splay-tree decoding means 145 and character string decompressing means 143 of claim 23. This embodiment is capable of decompressing LZSS codes from a code word that is a mixture of splay-tree codes (4), (5), and the lower bits of an address and decoding the LZSS codes into an original character string.

The code book storage unit 234 of FIG. 18 may store, instead of the tree (1), a tree (6) of codes corresponding to all characters and all addresses. The tree (6) corresponds to the code book 141 of claim 22. The code book storage unit 234 may also store, instead of the tree (3), the tree (5) mentioned above. The restoration controller 235 controls the elements of the decompress processing unit 230, to decompress an original character string from the code word of FIG. 10E.

Figure 20:
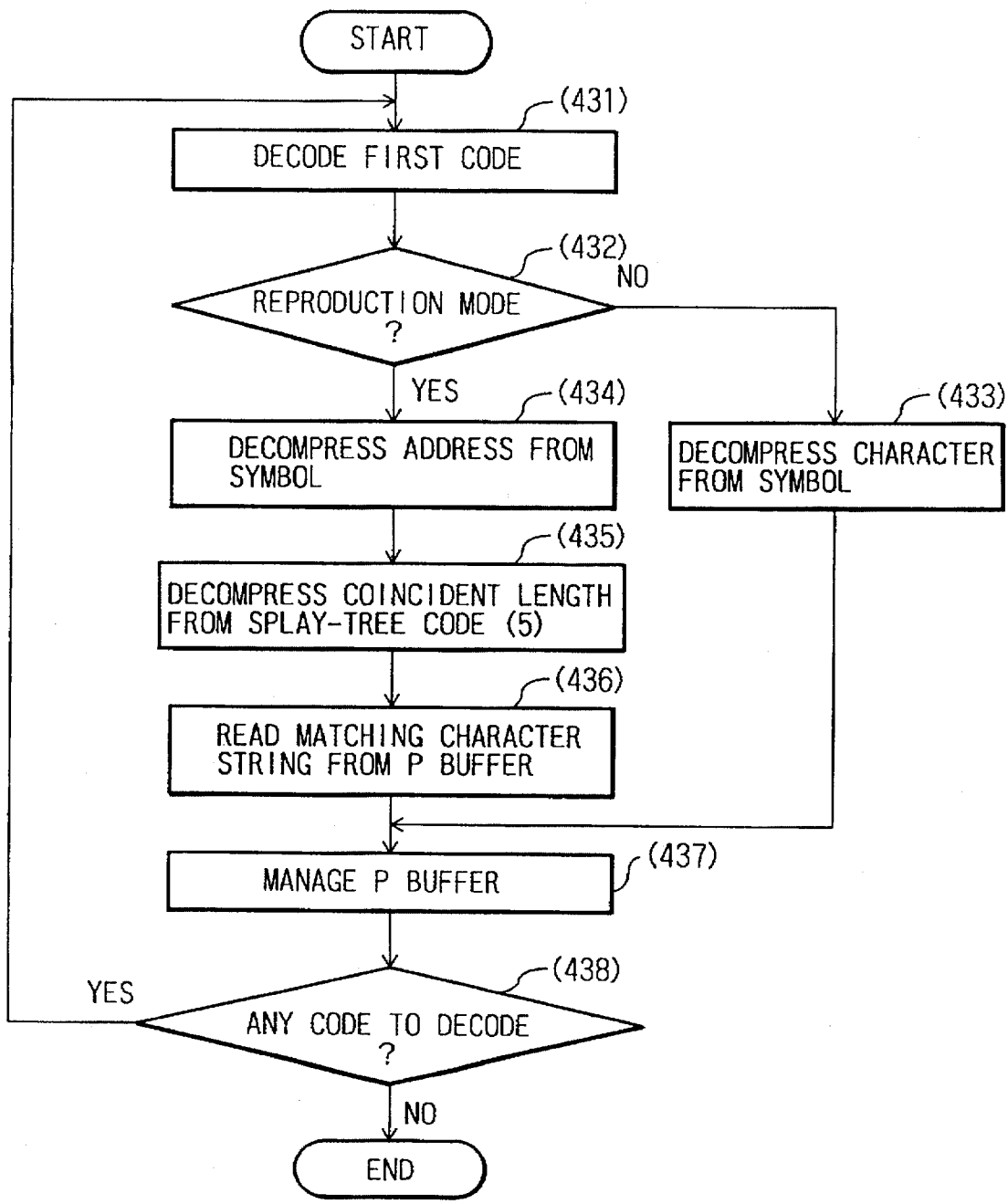
FIG. 20 is a flowchart showing a data decompressing operation.

FIG. 20 is a flowchart showing the data decompressing operation of this data decompressing apparatus.

Step 431 decodes a first code similar to the step 401, and step 432 determines a coding mode according to the decoded result similar to the step 402.

As explained above, the most significant bit of each symbol related to the tree (6) identifies whether the symbol represents a character or an address. Each symbol consists of 13 bits. Accordingly, the step 432 determines whether or not a number represented by a given symbol is larger than 4096, to determine whether or not the symbol has been prepared under the reproduction mode.

If the step 432 determines that it is the raw data mode, step 433 decompresses a character according to the decoded symbol, similar to the step 403. Then, the flow goes to step 437.

If the step 432 determines that it is the reproduction mode, the decompressing controller 235 decompresses the address of a coincidence start position in the P buffer 201 according to the symbol and sends the same to the reader 233 in step 434. In step 435, the decompressing controller 235 instructs the splay-tree decoder 232 to decode the next splay-tree code, i.e., a second code according to the tree (5) into a coincident length, which is sent to the reader 233.

In step 436, the reader 232 reads a character string out of the P buffer 201 according to the coincidence start position and coincident length.

Step 437 manages the P buffer similar to the step 407, and step 438 determines whether or not there is a code to decode similar to the step 408. If there is, the step 431 is repeated to decode the code.

In this embodiment, a code word consists of a splay-tree code (6) and a splay-tree code (5) as shown in FIG. 10E. Accordingly, the decompressing controller 235 instructs the splay-tree decoder 232 to properly switch the trees from one to another, to realize the function of the extraction means 132 of claims 22 and 23. The splay-tree decoder 232 uses a tree specified by the decompressing controller 235, to realize the functions of the splay-tree decoding means 142 of claim 22 and the splay-tree decoding means 145 of claim 23. The reader 233 operates according to decoded results, to realize the function of the character string decompressing means 143 of claim 23.

The code book storage unit 234 of FIG. 15 may store, instead of the tree (1), trees (7), (8)1 to (8)16, and (5). The decompressing controller 235 controls the elements of the decompressing processing unit 230, to realize the data decompressing apparatus of claim 24 for decompressing an original character string from the code word of FIG. 10F.

In this case, the tree (7) stored in the code book storage unit 234 corresponds to the code book 151 of claim 24, and the 16 code books (8)1 to (8)16 correspond to the code book 152.

Figure 21:
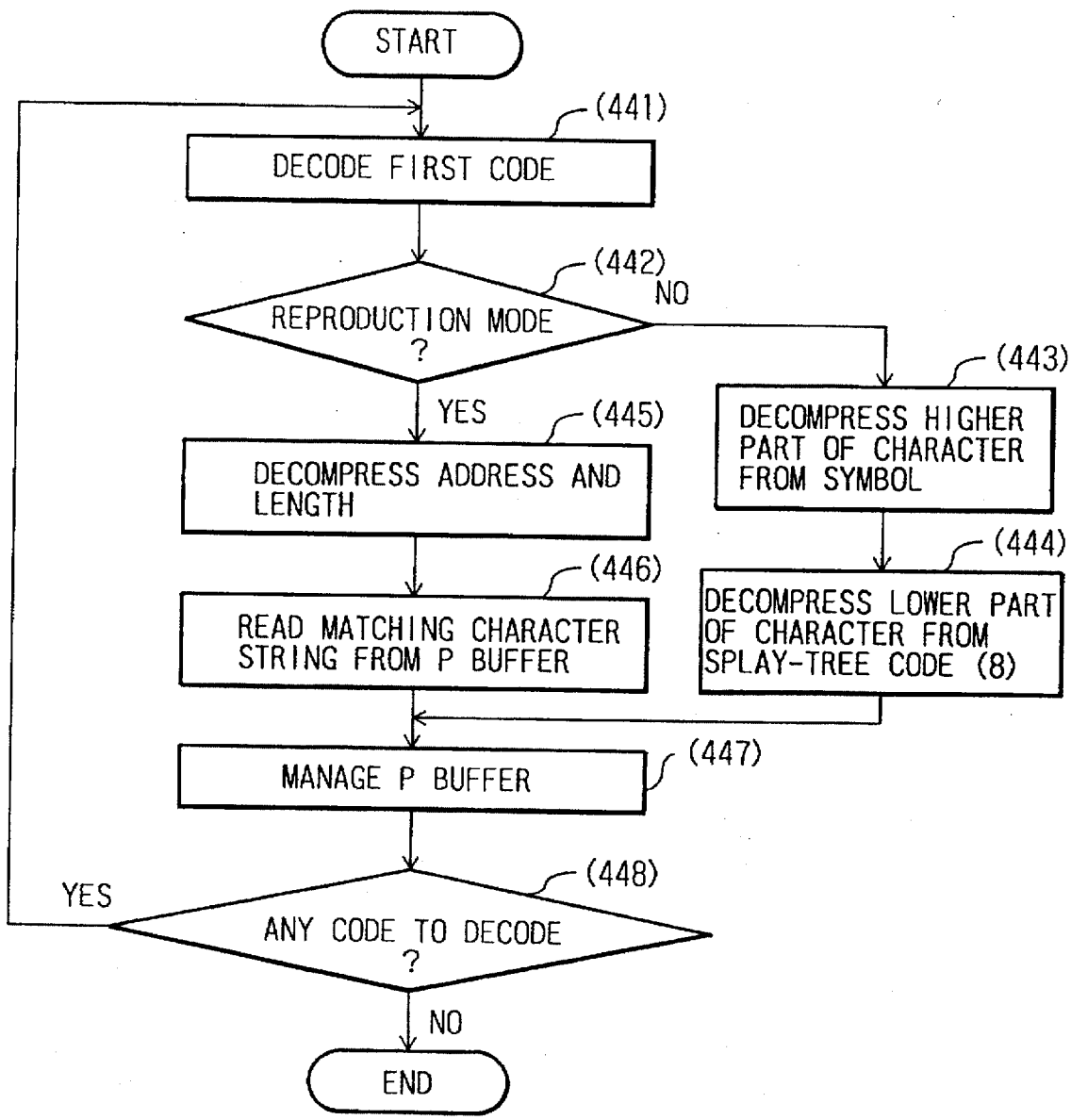
FIG. 21 is a flowchart showing a data decompressing operation.

FIG. 21 is a flowchart showing the data decompressing operation of the data decompressing apparatus of claim 24.

Step 441 decodes a first splay-tree code (7) similar to the step 401. According to the decoded result, step 442 determines a coding mode similar to the step 402. The most significant bit of a symbol related to the tree (7) identifies whether the symbol represents the higher part of a character, or a coincident length. Each symbol consists of 5 bits. Accordingly, the step 442 determines whether or not a value represented by a given symbol is larger than 16, to determine whether or not it is the reproduction mode.

If the step 442 determines that it is the raw data mode, the decompressing controller 235 decompresses in step 443 the higher part of a character string according to the decoded result of the step 441. The decompressing controller 235 instructs the splay-tree decoder 232 to decode the next splay-tree code (8) according to one of the trees (8) corresponding to the higher part.

The splay-tree decoder 232 uses the selected tree (8) to decode the input splay-tree code (8) in step 444. The decoded result is sent to the decompressing controller 235.

The decompressing controller 235 combines the higher part provided by the step 443 with the lower part provided by the step 444, to decompresses an original character. Then, the flow goes to step 447.

If the step 442 determines that it is the reproduction mode, the same steps as those of the steps 414 to 417 of FIG. 17 are carried out, and step 446 decompresses an original character string from the code word.

Step 447 manages the P buffer similar to the step 407, and step 448 determines whether or not there is a code word to decode similar to the step 408. If there is, the step 441 is repeated to decode the code word.

In this way, the decompressing controller 235 instructs the splay-tree decoder 232 to carry out a decoding process by switching trees from one to another, to thereby realize the functions of the extraction means 132 and 154 of claim 24. The splay-tree decoder 232 carries out a decoding process according to a tree specified by the decompressing controller 235, to realize the functions of the splay-tree decoding means 153 and splay-tree decoding means 155 of claim 24. The reader 233 operates according to the decoded result, to realize the function of the character string decompressing means 156 of claim 24.

In this way, each code word provided by the data compression apparatus of claim 12 is decoded into LZSS codes from which an original character string is restored.

The code book storage unit 234 of FIG. 15 may store, instead of the tree (1), trees (9), (8)1 to (8)16, and (2), so that the decompressing controller 235 controls the elements of the decompress processing unit 230, to decompress an original character string from the code word of FIG. 10G.

In this case, the step 446 of FIG. 21 carries out the steps 424 to 427 of FIG. 19 instead of the steps 414 to 417 of FIG. 17, to decompress LZSS codes from a code word of the reproduction mode and decode the LZSS codes into an original character string.

As explained above, the data compression apparatus of the present invention combines two modes of LZSS codes, to form variable-length codes. The present invention utilizes an unevenness in the frequencies of occurrence of the raw data mode and reproduction mode and an unevenness in the frequencies of occurrence of codes of the two modes, to compress LZSS codes. The present invention covers the disadvantages of the LZSS coding method and improves compression efficiency.

The present invention combines characters of the raw data mode and coincident lengths (or at least a part of each address) of the reproduction mode, to form variable-length codes. Under the reproduction mode, the present invention converts at least a part of an address (or a coincident length) into a variable-length code, to realize great compression effect.

The present invention divides each character of the raw data mode into a higher part and a lower part and combines the higher part of each character with codes prepared under the reproduction mode, to form variable-length codes. This method is capable of improving compression efficiency even on image data involving random components. In this case, the lower part of a character is subordinated to the higher part thereof, to deal with information involving random components as well as information such as text data including an unevenness in the frequencies of occurrence of characters.

On the other hand, the decompressing method and apparatus of the present invention find a coding mode according to a decoded result of a variable-length code extracted from a code word. According to the coding mode, the present invention decodes the code word into LZSS codes, which are decoded into an original character string according to a known restoration process.

We claim:

1. A method of compressing data by a slide dictionary technique that finds a longest matching character string in a coding character string and in a coded character string stored in a dictionary and activates, according to the length of the longest matching character string, a raw data mode to provide the matching character string that must consist of a single character string that must consist of a single character as it is as a code, or a reproduction mode to code the position and length of the matching character string in the dictionary 101, comprising the steps of:

consecutively numbering different codes to be prepared under the raw data mode and reproduction mode;

coding, according to a code book, a number corresponding to a code prepared under one of the raw data mode and reproduction mode;

rearranging the code book according to the code of the number, to shorten the length of the code of the number; and consecutively numbering code characters to be prepared under the raw data mode and different codes to be prepared under the reproduction mode.

2. A data compression method according to claim 1, including the step of consecutively numbering different codes to be prepared under the raw data mode and different coincident lengths to be found under the reproduction mode.

3. A data compression method according to claim 2, including the steps of:

coding, according to a code book, at least a part of the position of a matching character string under the reproduction mode; and rearranging the code book according to the coded position, to shorten the length of the coded position.

4. A data compression method according to claim 1, including the step of consecutively numbering different codes to be prepared under the raw data mode and every combination of bits of at least a part of the address of a matching character string to be found under the reproduction mode.

5. A data compression method according to claim 4, including the steps of:

coding, according to a code book, a coincident length under the reproduction mode; and rearranging the code book according to the code of the coincident length, to shorten the length of the code of the coincident length.

6. A method of compressing data by a slide dictionary technique that finds a longest matching character string in a coding character string and in a coded character string stored in a dictionary and activates, according to the length of the longest matching character string, a raw data mode to provide the matching character string that must consist of a single character string that must consist of a single character as it is as a code, or a reproduction mode to code the position and length of the matching character string in the dictionary 101, comprising the steps of:

consecutively numbering different codes to be prepared under the raw data mode and reproduction mode;

coding, according to a code book, a number corresponding to a code prepared under one of the raw data mode and reproduction mode;

rearranging the code book according to the code of the number, to shorten the length of the code of the number;

consecutively numbering every combination of higher bits of a code character to be prepared under the raw data mode and different codes to be prepared under the reproduction mode;

preparing a code book containing numbers allocated to combinations of lower bits of the code character, for each of the combinations of the higher bits of the code character; and forming, under the raw data mode, a variable-length code of a number allocated to the lower bits of a given code character, the number being found in the code book associated with the higher bits of the code character.

7. An apparatus for compressing data by a sliding-dictionary technique, having matching means for finding a longest matching character string in a coding character string and in a coded character string stored in a dictionary and coding means for selectively activating, according to the length of the longest matching character string, a raw data mode to provide the matching character string that must consist of a single character as it is as a code, or a reproduction mode to code the position and length of the matching character string in the dictionary, comprising:

a first code book containing a tree of codes corresponding to consecutive numbers allocated to characters to be prepared by the coding means under the raw data mode and coincident lengths to be found by the coding means under the reproduction mode; and first splay-tree coding means for retrieving, from the first code book, a code corresponding to a character prepared under the raw data mode or a coincident length found under the reproduction mode, and rearranging the tree to halve the length of the retrieved code.

8. A data compression apparatus according to claim 7, including:

a second code book containing a tree of codes corresponding to combinations of at least a part of bits of the address of a matching character string to be provided by the coding means under the reproduction mode; and second splay-tree coding means for retrieving, from the second code book, a code corresponding to at least a part of an input address, and rearranging the tree to halve the length of the retrieved code.

9. An apparatus for compressing data by a sliding-dictionary technique, having matching means for finding a longest matching character string in a coding character string and in a coded character string stored in a dictionary and coding means for selectively activating, according to the length of the longest matching character string, a raw data mode to provide the matching character string that must consist of a single character as it is as a code, or a reproduction mode to code the position and length of the matching character string in the dictionary, comprising:

a first code book containing a tree of codes corresponding to consecutive numbers allocated to characters to be prepared by the coding means under the raw data mode and every combination of bits of at least a part of the address of a matching character string to be found by the coding means under the reproduction mode; and first splay-tree coding means for retrieving, from the first code book, a code corresponding to a character prepared under the raw data mode or at least a part of the input address found under the reproduction mode, and rearranging the tree to halve the length of the retrieved code.

10. A data compression apparatus according to claim 9, including:

a second code book containing a tree of codes corresponding to coincident lengths to be found by the coding means under the reproduction mode; and second splay-tree coding means for retrieving, from the second code book, a code according to an input coincident length, and rearranging the tree to halve the length of the retrieved code.

11. An apparatus for compressing data by a sliding-dictionary technique, having matching means for finding a longest matching character string in a coding character string and in a coded character string in a coded character string stored in a dictionary and coding means for selectively activating, according to the length of the longest matching character string, a raw data mode to provide the matching character string that must consist of a single character as it is as a code, or a reproduction mode to code the position and length of the matching character string in the dictionary comprising:

a first code book containing a tree of codes corresponding to consecutive numbers allocated to every combination of higher bits of a character to be prepared by the coding means under the raw data mode and different codes to be prepared by the coding means under the reproduction mode;

a second code book containing a tree of codes allocated to every combination of lower bits of the character, for each of the combinations of the higher bits of the character;

first splay-tree coding means for retrieving, from the first code book, a code corresponding to the higher part of a character prepared under the raw data mode or a code prepared under the reproduction mode, and rearranging the tree to halve the length of the retrieved code; and second splay-tree coding means for selecting one of the trees in the second code book according to the higher part of the character prepared under the raw data mode, retrieving a code corresponding to the lower part of the character, and rearranging the tree to halve the length of the retrieved code.

12. A method of decompressing an original character string from codes prepared by a sliding-dictionary-type data compression method that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary, comprising the steps of:

consecutively numbering different codes to be prepared under the raw data mode and reproduction mode and preparing a first code book containing codes corresponding to the consecutive numbers;

extracting, from an input code, a first code corresponding to one of the consecutive numbers and decoding the first code according to the first code book;

rearranging the first code book according to the code, to shorten the length of the code;

determining whether it is the raw data mode or reproduction mode according to the number restored from the first code; and carrying out a decompressing process proper for the determined mode, on a code corresponding to the number.

13. A data decompressing method according to claim 12, including the steps of:

consecutively numbering code characters to be prepared under the raw data mode and different codes to be prepared under the reproduction mode; and decompressing an original character string according to the number decompressed from the first code if the first code indicates the raw data mode, and accumulating the original character string in a dictionary.

14. A data decompressing method according to claim 12, including the steps of:

consecutively numbering different codes to be prepared under the raw data mode and different coincident lengths to be found under the reproduction mode; and decompressing a coincident length according to the number decompressed from the first code if the first code indicates the reproduction mode.

15. A data decompressing method according to claim 14, including the steps of:

preparing a second code book containing codes corresponding to at least a part of the position of each matching character string;

extracting a second code following the first code according to the second code book if the first code indicates the reproduction mode;

decoding the second code according to the second code book, to decompress at least a part of the position of the matching character string; and rearranging the second code book according to the code, to shorten the length of the code.

16. A data decompressing method according to claim 12, including the steps of:

consecutively numbering different codes to be prepared under the raw data mode and every combination of bits of at least a part of the address of a matching character string to be found under the reproduction mode, and preparing a first code book containing codes corresponding to the consecutive numbers; and decompressing at least a part of an address according to the number decompressed from the first code if the first code indicates the reproduction mode.

17. A data decompressing method according to claim 16, including the steps of:

preparing a second code book containing codes corresponding to coincident lengths;

extracting a second code following the first code according to the second code book if the first code indicates the reproduction mode;

decompressing a coincident length from the second code according to the second code book; and rearranging the second code book according to the code, to shorten the length of the code.

18. A data decompressing method according to claim 12, including the steps of:

consecutively numbering every combination of higher bits of a code character to be prepared under the raw data mode and different codes to be prepared under the reproduction mode;

preparing a code book containing numbers allocated to combinations of lower bits of the code character, for each of the combinations of the higher bits of the code character;

decompressing the higher part of a character according to the number decompressed from the first code that must be a variable-length code, if the first code indicates the raw data mode;

extracting a variable-length code following the first code as a second code; and decompressing the lower part of the character from the second code according to the code book corresponding to the higher part of the character.

19. A data decompressing apparatus having decompress processing means for decompressing an original character string from codes prepared by a sliding-dictionary-type data compression method that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary, and a dictionary for accumulating the decompressed original character string, the decompress processing means comprising:

a first code book containing a tree of codes corresponding to consecutive numbers allocated to characters to be prepared under the raw data mode and coincident lengths to be found under the reproduction mode;

extraction means for extracting, from an input code, a variable-length code as a first code;

first splay-tree decoding means for decoding the first code into a number according to the first code book and rearranging the tree to halve the length of the code;

decision means for determining whether it is the raw data mode or reproduction mode according to the number decompressed from the first code; and character string decompressing means for decompressing a character string by finding the same according to the number if it is the raw data mode, or by retrieving the same from the dictionary according to a coincident length obtained from the number if it is the reproduction mode.

20. A data decompressing apparatus according to claim 19, wherein the decompress processing means includes:

a second code book containing a tree of codes corresponding to every combination of at least a part of bits of the address of a matching character string to be found under the reproduction mode; and second splay-tree decoding means for decompressing a bit string from an input variable-length code according to the second code book and rearranging the tree to halve the length of the code, the extraction means extracting, as a second code, a variable-length code following the first code if the first code indicates the reproduction mode and sending the second code to the second splay-tree decoding means, the character string decompressing means retrieving, if it is the reproduction mode, a matching character string from the dictionary according to the coincident length specified by the number provided by the first splay-tree decoding means and an address represented by a bit string provided by the second splay-tree decoding means.

21. A data decompressing apparatus having decompress processing means for decompressing an original character string from codes prepared by a sliding-dictionary-type compression method that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary, and a dictionary for accumulating the decompressed original character string, the decompressing processing means comprising:

a first code book containing a tree of codes corresponding to consecutive numbers allocated to characters to be prepared under the raw data mode and every combination of bits of at least a part of the address of a matching character string to be found under the reproduction mode;

extraction means for extracting, from an input code, a variable-length code as a first code;

first splay-tree decoding means for decoding the first code into a number according to the first code book and rearranging the tree to halve the length of the code;

decision means for determining whether it is the raw data mode or reproduction mode according to the number decompressed from the first code; and character string decompressing means for decompressing a character string by finding the same according to the number if it is the raw data mode, or by retrieving the same from the dictionary according to at least a part of an address obtained from the number if it is the reproduction mode.

22. A data decompressing apparatus according to claim 21, wherein the decompress processing means includes:

a second code book containing a tree of codes corresponding to coincident lengths to be found under the reproduction mode; and second splay-tree decoding means for decompressing a coincident length from an input variable-length code according to the second code book and rearranging the tree to halve the length of the code, the extraction means extracting, as a second code, a variable-length code following the first code if the first code indicates the reproduction mode and sending the second code to the second splay-tree decoding means, the character string decompressing means retrieving, if it is the reproduction mode, a matching character string from the dictionary according to an address specified by the number provided by the first splay-tree decoding means and a coincident length provided by the second splay-tree decoding means.

23. A data decompressing apparatus having decompress processing means for decompressing an original character string from codes prepared by a sliding-dictionary-type data compression method that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary, and a dictionary for accumulating the restored original character string, the decompressing processing means comprising:

a first code book containing a tree of codes corresponding to consecutive numbers allocated to every combination of higher bits of a character to be prepared under the raw data mode and different codes to be prepared under the reproduction mode;

a second code book containing a tree of codes corresponding to every combination of lower bits of the character, for each of the combinations of the higher bits of the character;

first extraction means for extracting, from an input code, a variable-length code as a first code;

first splay-tree decoding means for decoding the first code into a number according to the first code book and rearranging the tree to halve the length of the code;

decision means for determining whether it is the raw data mode or reproduction mode according to the number decompressed from the first code;

second extraction means for extracting a variable-length second code following the first code if it is the raw data mode;

second splay-tree decoding means for selecting one of the trees from the second code book according to the higher part of a character specified by the number provided by the first splay-tree decoding means if it is the raw data mode, decoding the second code into the lower part of the character, and rearranging the trees to halve the length of the code; and character string decompressing means for decompressing the character string by combining the higher part of the character specified by the number provided by the first splay-tree decoding means with the lower part of the character provided by the second splay-tree decoding means if it is the raw data mode, or by retrieving the same from the dictionary according to a code corresponding to the number if it is the reproduction mode.

24. An apparatus for compressing data by a sliding-dictionary technique, having a matching unit which finds a longest matching character string in a coding character string and in a coded character string stored in a dictionary and a coder which selectively activates, according to the length of the longest matching character string, a raw data mode to provide the matching character string that must consist of a single character as it is as a code, or a reproduction mode to code the position and length of the matching character string in the dictionary, comprising:

a first code book containing a tree of codes corresponding to consecutive numbers allocated to characters to be prepared by the coder under the raw data mode and coincident lengths to be found by the coder under the reproduction mode; and a first splay-tree coder retrieving, from the first code book, a code corresponding to a character prepared under the raw data mode or a coincident length found under the reproduction mode, and rearranging the tree to halve the length of the retrieved code.

25. A data compression apparatus according to claim 24, including:

a second code book containing a tree of codes corresponding to combinations of at least a part of bits of the address of a matching character string to be provided by the coder under the reproduction mode; and a second splay-tree coder retrieving, from the second code book, a code corresponding to at least a part of an input address, and rearranging the tree to halve the length of the retrieved code.

26. An apparatus for compressing data by a sliding-dictionary technique, having a matching unit which finds a longest matching character string in a coding character string and in a coded character string stored in a dictionary and a coder which selectively activates, according to the length of the longest matching character string, a raw data mode to provide the matching character string that must consist of a single character as it is as a code, or a reproduction mode to code the position and length of the matching character string in the dictionary, comprising:

a first code book containing a tree of codes corresponding to consecutive numbers allocated to characters to be prepared by the coder under the raw data mode and every combination of bits of at least a part of the address of a matching character string to be found by the coder under the reproduction mode; and a first splay-tree coder retrieving, from the first code book, a code corresponding to a character prepared under the raw data mode or at least a part of the input address found under the reproduction mode, and rearranging the tree to halve the length of the retrieved code.

27. A data compression apparatus according to claim 26, including:

a second code book containing a tree of codes corresponding to coincident lengths to be found by the coder under the reproduction mode; and a second splay-tree coder retrieving, from the second code book, a code according to an input coincident length, and rearranging the tree to halve the length of the retrieved code.

28. An apparatus for compressing data by a sliding-dictionary technique, having a matching unit which finds a longest matching character string in a coding character string and in a coded character string in a coded character string stored in a dictionary and a coder which selectively activates, according to the length of the longest matching character string, a raw data mode to provide the matching character string that must consist of a single character as it is as a code, or a reproduction mode to code the position and length of the matching character string in the dictionary comprising:

a first code book containing a tree of codes corresponding to consecutive numbers allocated to every combination of higher bits of a character to be prepared by the coder under the raw data mode and different codes to be prepared by the coder under the reproduction mode;

a second code book containing a tree of codes allocated to every combination of lower bits of the character, for each of the combinations of the higher bits of the character;

a first splay-tree coder retrieving, from the first code book, a code corresponding to the higher part of a character prepared under the raw data mode or a code prepared under the reproduction mode, and rearranging the tree to halve the length of the retrieved code; and a second splay-tree coder selecting one of the trees in the second code book according to the higher part of the character prepared under the raw data mode, retrieving a code corresponding to the lower part of the character, and rearranging the tree to halve the length of the retrieved code.

29. A data decompressing apparatus having decompress processing unit decompressing an original character string from codes prepared by a sliding-dictionary-type data compression method that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary, and a dictionary for accumulating the decompressed original character string, the decompress processing unit comprising:

a first code book containing a tree of codes corresponding to consecutive numbers allocated to characters to be prepared under the raw data mode and coincident lengths to be found under the reproduction mode;

an extractor extracting, from an input code, a variable-length code as a first code;

a first splay-tree decoder decoding the first code into a number according to the first code book and rearranging the tree to halve the length of the code;

a decision unit determining whether it is the raw data mode or reproduction mode according to the number decompressed from the first code; and a character string decompressing unit decompressing a character string by finding the same according to the number if it is the raw data mode, or by retrieving the same from the dictionary according to a coincident length obtained from the number if it is the reproduction mode.

30. A data decompressing apparatus according to claim 29, wherein the decompress processing unit includes:

a second code book containing a tree of codes corresponding to every combination of at least a part of bits of the address of a matching character string to be found under the reproduction mode; and a second splay-tree decoder decompressing a bit string from an input variable-length code according to the second code book and rearranging the tree to halve the length of the code, the extractor extracting, as a second code, a variable-length code following the first code if the first code indicates the reproduction mode and sending the second code to the second splay-tree decoder, the character string decompressing unit retrieving, if it is the reproduction mode, a matching character string from the dictionary according to the coincident length specified by the number provided by the first splay-tree decoder and an address represented by a bit string provided by the second splay-tree decoder.

31. A data decompressing apparatus having decompress processing unit decompressing an original character string from codes prepared by a sliding-dictionary-type compression method that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary, and a dictionary for accumulating the decompressed original character string, the decompressing processing means comprising:

a first code book containing a tree of codes corresponding to consecutive numbers allocated to characters to be prepared under the raw data mode and every combination of bits of at least a part of the address of a matching character string to be found under the reproduction mode;

an extractor extracting, from an input code, a variable-length code as a first code;

a first splay-tree decoder decoding the first code into a number according to the first code book and rearranging the tree to halve the length of the code;

a decision unit determining whether it is the raw data mode or reproduction mode according to the number decompressed from the first code; and a character string decompressing unit decompressing a character string by finding the same according to the number if it is the raw data mode, or by retrieving the same from the dictionary according to at least a part of an address obtained from the number if it is the reproduction mode.

32. A data decompressing apparatus according to claim 31, wherein the decompress processing means includes:

a second code book containing a tree of codes corresponding to coincident lengths to be found under the reproduction mode; and a second splay-tree decoding unit decompressing a coincident length from an input variable-length code according to the second code book and rearranging the tree to halve the length of the code, the extractor extracting, as a second code, a variable-length code following the first code if the first code indicates the reproduction mode and sending the second code to the second splay-tree decoder, the character string decompressing unit retrieving, if it is the reproduction mode, a matching character string from the dictionary according to an address specified by the number provided by the first splay-tree decoder and a coincident length provided by the second splay-tree decoder.

33. A data decompressing apparatus having decompress processing unit decompressing an original character string from codes prepared by a sliding-dictionary-type data compression method that finds a longest matching character string in a coding character string and in a coded character string stored in a dictionary and activates, according to the length of the longest matching character string, a raw data mode to provide the matching character string that must consist of a single character as it is as a code, or a reproduction mode to code the position and length of the matching character string in the dictionary, and a dictionary for accumulating the restored original character string, the decompressing processing means comprising:

- a first code book containing a tree of codes corresponding to consecutive numbers allocated to every combination of higher bits of a character to be prepared under the raw data mode and different codes to be prepared under the reproduction mode;
- a second code book containing a tree of codes corresponding to every combination of lower bits of the character, for each of the combinations of the higher bits of the character;
- a first extractor extracting, from an input code, a variable-length code as a first code;
- a first splay-tree decoder decoding the first code into a number according to the first code book and rearranging the tree to halve the length of the code;
- a decision unit determining whether it is the raw data mode or reproduction mode according to the number decompressed from the first code;
- a second extractor extracting a variable-length second code following the first code if it is the raw data mode;
- a second splay-tree decoder selecting one of the trees from the code book according to the higher part of a character specified by the number provided by the first splay-tree decoder if it is the raw data mode, decoding the second code into the lower part of the character, and rearranging the trees to halve the length of the code; and
- a character string decompressing unit decompressing the character string by combining the higher part of the character specified by the number provided by the first splay-tree decoder with the lower part of the character provided by the second splay-tree decoder if it is the raw data mode, or by retrieving the same from the dictionary according to a code corresponding to the number if it is the reproduction mode.

* * * * *

UNITED STATES PATENT AND TRADEMARK OFFICE
CERTIFICATE OF CORRECTION

PATENT NO. : 5,673,042
DATED : Sep. 30, 1997
INVENTOR(S) : YOSHIDA et al.

It is certified that error appears in the above-identified patent and that said Letters Patent is hereby corrected as shown below:

Col. 1,  line 33, change ""LEA"" to --"LHA"--.

Signed and Sealed this

Twentieth Day of January, 1998

Attest:

BRUCE LEHMAN

Attesting Officer          Commissioner of Patents and Trademarks